(12) United States Patent
Yamanoue

(10) Patent No.: US 12,388,375 B2
(45) Date of Patent: Aug. 12, 2025

(54) SWITCHING MODULE INCLUDING HEAT RADIATION MEMBER AND INVERTER INCLUDING THE SAME

(71) Applicant: Mazda Motor Corporation, Hiroshima (JP)

(72) Inventor: Kouichi Yamanoue, Hiroshima (JP)

(73) Assignee: MAZDA MOTOR CORPORATION, Hiroshima (JP)

( * ) Notice: Subject to any disclaimer, the term of this patent is extended or adjusted under 35 U.S.C. 154(b) by 285 days.

(21) Appl. No.: 18/125,199

(22) Filed: Mar. 23, 2023

(65) Prior Publication Data

US 2024/0106349 A1 Mar. 28, 2024

(30) Foreign Application Priority Data

Sep. 28, 2022 (JP) ................................ 2022-154433

(51) Int. Cl.
| | |
|---|---|
| *H02M 7/00* | (2006.01) |
| *H01L 23/00* | (2006.01) |
| *H01L 25/065* | (2023.01) |
| *H02M 1/44* | (2007.01) |
| *H02M 7/5387* | (2007.01) |
| *H02P 27/06* | (2006.01) |

(52) U.S. Cl.
CPC ........ *H02M 7/53871* (2013.01); *H01L 24/48* (2013.01); *H01L 25/0655* (2013.01); *H02P 27/06* (2013.01); *H01L 2224/48091* (2013.01); *H01L 2224/73265* (2013.01)

(58) Field of Classification Search
CPC ..... H02M 7/003; H02M 1/44; H01L 25/0655; H01L 2224/48091; H01L 2224/73265
See application file for complete search history.

(56) References Cited

U.S. PATENT DOCUMENTS

| | | | | |
|---|---|---|---|---|
| 10,506,744 | B2* | 12/2019 | Kosuga | ................. H01L 23/473 |
| 11,901,837 | B2* | 2/2024 | Kurokawa | ............ H02M 3/003 |
| 11,908,778 | B2* | 2/2024 | Ishino | ................. H01L 23/4334 |

(Continued)

FOREIGN PATENT DOCUMENTS

| | | |
|---|---|---|
| DE | 112013002474 T5 | 1/2015 |
| JP | 2017-154900 A | 9/2017 |
| JP | 2018-195694 A | 12/2018 |

*Primary Examiner* — Sisay G Tiku
(74) *Attorney, Agent, or Firm* — XSENSUS LLP

(57) ABSTRACT

A switching module 120 includes a positive-side conductor 51 in contact with an input-side electrode 30a provided on each upper arm switching element 30U, a negative-side conductor 52 connected to an output-side electrode 30b of each lower arm switching element 30L, and an electric insulating member 140 in contact with, at its upper surface, each output conductor 53 in contact with the input-side electrode 30a of each lower arm switching element 30L and in contact with, at its lower surface, an electric conductive heat radiation member 42. Each positive-side electric conductive layer 61 connected to the positive-side conductor 51 faces a corresponding one of negative-side electric conductive layers 62 connected to the negative-side conductor 52 via the electric insulating layer 60 such that a storage structure 63 interposed between the positive-side main line 21 and the negative-side main line 22 to store charge is inside the electric insulating member 140.

19 Claims, 14 Drawing Sheets

(56) References Cited

U.S. PATENT DOCUMENTS

| | | | |
|---|---|---|---|
| 2009/0015185 A1* | 1/2009 | Yoshida | B60K 6/445 |
| | | | 318/504 |
| 2015/0326221 A1 | 11/2015 | Totani | |
| 2018/0337107 A1 | 11/2018 | Kida et al. | |
| 2024/0030079 A1* | 1/2024 | Yamanoue | H01L 23/49589 |
| 2024/0032266 A1* | 1/2024 | Yamanoue | H05K 7/20936 |

* cited by examiner

IMPROVED MODULE

SECOND IMPROVED MODULE

FIG.12
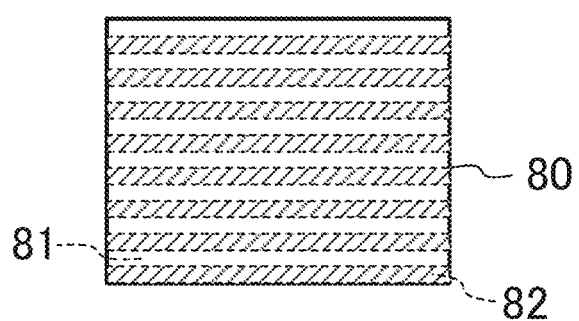
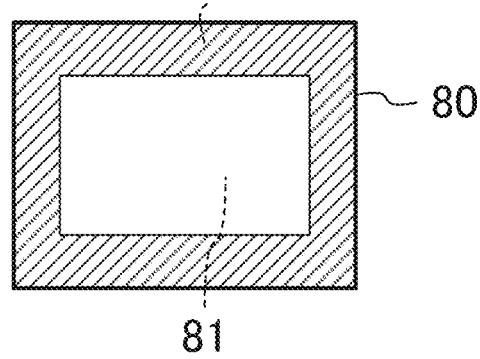
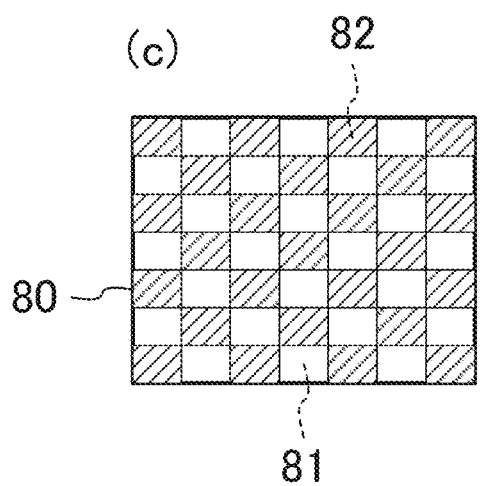

SWITCHING MODULE INCLUDING HEAT RADIATION MEMBER AND INVERTER INCLUDING THE SAME

CROSS-REFERENCE TO RELATED APPLICATION

The present application claims priority to Japanese Patent Application No. 2022-154433, filed on Sep. 28, 2022, the entire contents of which are incorporated herein by reference.

BACKGROUND

The technique disclosed herein relates to a switching module and an inverter, on which switching control is performed, and particularly relates to a switching module and an inverter suitable for use on a vehicle.

BACKGROUND

In recent years, vehicles have been increasingly motorized. The vehicles are motorized in such a manner that an inverter is controlled using DC power supplied from a high-voltage battery for drive and a motor is driven accordingly. In this case, a power loss is caused in the inverter.

Reduction in the power loss is a significant challenge in vehicle motorization. That is, there has been a demand for improvement in the efficiency of a switching module used for the inverter.

For this reason, an improved semiconductor device of, e.g., silicon carbide (SiC) has been employed for the switching module. This has improved switching control to be performable at high speed.

However, when the switching control is performed at high speed, there is a problem that harmonic noise is caused due to a high-frequency current flow caused by a periodic voltage change associated with such high-speed switching control.

As the harmonic noise, current (normal mode current) flowing to the battery via an electric line and current (common mode current) flowing not only via an electric line but also via a stray capacitance (parasitic capacitance) and the ground (earth) are well-known. Due to these types of current, electromagnetic noise (normal mode noise and common mode noise) is caused.

These types of electromagnetic noise would cause malfunction of electric devices located nearby, communication disturbance, etc. For this reason, in order to speed up the switching control, it is inevitable to suppress these types of electromagnetic noise.

A smoothing capacitor that suppresses the normal mode noise is placed in a DC link of the inverter.

That is, the smoothing capacitor supplies stored power to the switching module. Accordingly, a high-frequency impedance between positive and negative supply powers from the battery can be reduced. High-frequency current flowing to the battery substantially flows via the smoothing capacitor. Thus, the smoothing capacitor can suppress the normal mode noise.

A technique of suppressing the common mode noise has also been proposed. For example, Japanese Unexamined Patent Publication No. 2018-195694 discloses a technique of reducing common mode noise caused in a half-bridge circuit (circuit configured such that two switching elements are connected in series).

In the case of the half-bridge circuit, a voltage change is great at a midpoint between the two switching elements. Thus, in the technique of Japanese Unexamined Patent Publication No. 2018-195694, a heat sink (second heat sink 19) facing a conductive plate (midpoint conductive plate 15) at the midpoint via an insulating layer 31 is insulated from a ground terminal 24 (for the sake of easy explanation, reference numerals in Japanese Unexamined Patent Publication No. 2018-195694 are used herein for explaining Japanese Unexamined Patent Publication No. 2018-195694).

With this configuration, common mode current flowing from the midpoint conductive plate 15 is reduced, and accordingly, common mode noise accompanying the common mode current is reduced.

SUMMARY

Technical Problems

When the switching control is performed, resonance occurs between the DC link and each switching element. Accordingly, small vibration (ringing) occurs in the waveforms of the operating current and voltage of each switching element (see a reference numeral Y1 in FIG. 1).

As the switching control is speeded up, the amplitude of the ringing increases. Thus, the ringing is a cause for the normal mode noise and the common mode noise because the ringing includes a high frequency component.

Further, the ringing causes surge voltage (instantaneously-caused excessive voltage). When such surge voltage exceeds the withstand voltage limit of the switching element, a semiconductor of the switching element is damaged. Thus, for each switching element, a withstand voltage property sufficiently higher than the voltage of the battery with a sufficient allowance against such voltage is required. As a result, the switching element is inevitably expensive, and is a cause for an increase in the cost of the switching module and therefore the cost of the inverter.

That is, current (ripple current) flows in the smoothing capacitor when the motor is driven under inverter control. Accordingly, the smoothing capacitor generates heat due to a power loss caused by the ripple current and internal resistance.

However, a film capacitor configured such that a plurality of films are stacked on each other is generally employed as the smoothing capacitor. Thus, heat radiation from the smoothing capacitor is difficult. Particularly, in the case of an in-vehicle inverter, in which the smoothing capacitor is large, the heat radiation from the smoothing capacitor is difficult.

For these reasons, avoidance of the temperature increase in the smoothing capacitor for attaining reliability requires suppressing heat generation therein by reduction in the internal resistance thereof. Thus, the capacitance of the smoothing capacitor needs to be an excessive value more than necessary. For this reason, the smoothing capacitor is also expensive, and is a great cause for an inverter cost increase.

Thus, the technique disclosed herein has an object of attaining a switching module capable of reducing the inverter cost by miniaturizing or omitting a smoothing capacitor, even though the function that the smoothing capacitor provides is still maintained in the switching module. The technique also has an object of attaining a switching module in which common mode noise can be reduced.

Solution to the Problems

The technique disclosed herein relates to a switching module, on which switching control is performed, and which includes positive and negative-side main lines each connected respectively to positive and negative electrodes of a battery, a plurality of half-bridge circuits each of which includes upper and lower arm switching elements connected in series in an order from a positive-side main line side between the positive and negative-side main lines, and a plurality of output lines each of which is connected between the upper and lower arm switching elements in a corresponding one of the half-bridge circuits, switching control being performed on the switching module.

The switching module includes a positive-side conductor in contact with an input-side electrode provided on the lower surface of each upper arm switching element and forming the positive-side main line, a negative-side conductor connected to an output-side electrode of each lower arm switching element and forming the negative-side main line, an output conductor in contact with an input-side electrode provided on the lower surface of each lower arm switching element and forming each output line, and an electric insulating member being in contact with, at an upper surface thereof, each of the positive-side conductor, the negative-side conductor, and the output conductor and being in contact with, at a lower surface thereof, a heat radiation member having electrical conductivity.

The electric insulating member includes a plurality of positive-side electric conductive layers connected to the positive-side conductor, and a plurality of positive-side electric conductive layers connected to the negative-side conductor. Each positive-side electric conductive layer faces a corresponding one of the positive-side electric conductive layers via an electric insulating layer such that a storage structure interposed between the positive-side main line and the negative-side main line to store charge is provided inside the electric insulating member.

That is, according to the switching module, the electric insulating member contacts the heat radiation member, and therefore, heat of the electric insulating member can be radiated to the heat radiation member. Thus, even when heat is generated, due to the switching control, on a circuit provided on, e.g., the lower arm switching element, such heat can be radiated via the electric insulating member.

Each positive-side electric conductive layer faces a corresponding one of the negative-side electric conductive layers via the electric insulating layer such that the particular storage structure interposed between the positive-side main line and the negative-side main line is provided inside the electric insulating member. When the switching module is placed in the inverter, this storage structure is connected in parallel with a smoothing capacitor.

That is, the storage structure can function as the smoothing capacitor, and therefore, be used as a replacement for the smoothing capacitor. As a result, the smoothing capacitor can be miniaturized or be omitted, while the function of the smoothing capacitor is maintained. In this way, such a switching module that can reduce an inverter cost can be realized.

In addition, the storage structure is provided inside the electric insulating member, and therefore, heat can be easily radiated. Thus, an excessive capacitance is not necessary for, e.g., a film capacitor, and therefore, such a switching module can be realized with the electric insulating member with a small size and a small capacitance.

Further, since the storage structure and each switching element are substantially integrated, a parasitic inductance caused due to connection of the smoothing capacitor via an electric line can be eliminated. Accordingly, ringing of the waveforms of current and voltage flowing in the half-bridge circuit due to the switching control can be suppressed. Moreover, surge voltage can also be suppressed, and therefore, an excessive withstand voltage of the switching element is not necessary and the switching module can be inexpensive.

The storage structure may be such that positive-side electric conductive layers and the positive-side electric conductive layers are alternately formed so as to extend in parallel with the upper and lower surfaces of the electric insulating member, and each positive-side electric conductive layer faces a corresponding one of the positive-side electric conductive layers via the electric insulating layer in the thickness direction of the electric insulating member.

With this configuration, the storage structure can be efficiently arranged inside the electric insulating member. Accordingly, the thickness of the electric insulating member can be decreased while a high capacitance of the storage structure is ensured. As a result, heat radiation of the electric insulating member can be enhanced in terms of structure.

The upper arm switching elements and the lower arm switching elements may be concentratedly arranged in a center portion on the upper surface of the electric insulating member, and the storage structure may be provided in an outer edge portion of the electric insulating member.

With this configuration, the group of the switching elements and the storage structure do not overlap with each other. When the switching control is performed, each of the storage structure and the switching elements generates heat, but such heat can be efficiently transferred to the heat radiation member and be radiated from the heat radiation member.

The storage structure may be interposed between the heat radiation member and a midpoint portion where at least each lower arm switching element is positioned.

With this configuration, the flow of common mode current can be prevented, and occurrence of common mode noise can be prevented. That is, when the switching control is performed, voltage periodically greatly changes at the midpoint portion where each lower arm switching element is positioned. In a conventional case, the common mode current flows, and the common mode noise occurs accordingly.

On the other hand, the potential of each of the positive and negative-side electric conductive layers of the storage structure does not change even when the switching control is performed. Thus, no current flows in a current path passing through the electric insulating member and the heat radiation member. Almost entire common mode current can be eliminated, and almost entire common mode noise can be eliminated accordingly.

The storage structure may be provided over the entire area of the electric insulating member.

With this configuration, the current path passing through the electric insulating member and the heat radiation member can be reliably blocked. Therefore, the common mode noise can be stably suppressed. In addition, the shape of each of the positive and negative-side electric conductive layers is simplified to facilitate formation thereof. Thus, the electric insulating member can be easily manufactured.

The positive-side electric conductive layers and the positive-side electric conductive layers may include: positive and negative-side parallel layers extending so as to face the upper and lower surfaces of the electric insulating member via the electric insulating layer; and a plurality of positive-side orthogonal layers and a plurality of negative-side orthogonal layers which are orthogonal to the positive-side parallel layer and the negative-side parallel layer and are alternately formed so as to extend in parallel with either one of end surfaces of the electric insulating member. The storage structure may be such that positive-side orthogonal layers and the negative-side orthogonal layers may face each other via the electric insulating layer in a side direction orthogonal to the thickness direction of the electric insulating member.

This configuration is another aspect of the above-described storage structure. The storage structure can be selected in accordance with the specifications of the electric insulating member, and therefore, has excellent versatility.

The storage structure may be interposed between the heat radiation member and a midpoint portion where at least each lower arm switching element is positioned.

With this configuration, the common mode noise can be suppressed as described above.

The midpoint portion may face the positive-side parallel layer or the negative-side parallel layer via the electric insulating layer.

With this configuration, the current path passing through the electric insulating member and the heat radiation member can be easily blocked. Therefore, the common mode noise can be stably suppressed.

The storage structure may be provided over the entire area of the electric insulating member.

With this configuration, the current path passing through the electric insulating member and the heat radiation member can be reliably blocked. The common mode noise can be more stably suppressed. In addition, the shape of each of the positive and negative-side electric conductive layers is simplified to facilitate formation thereof. Thus, the electric insulating member can be easily manufactured.

The electric insulating member may be made of such a ceramic material that a high permittivity material having a higher relative permittivity than that of aluminum oxide and a high thermal conductive material having a higher thermal conductivity than that of aluminum oxide are mixed at a predetermined ratio.

In the case of this switching module, the storage structure is provided in the electric insulating member, and therefore, high thermal conductivity and capacitance are required for the electric insulating member. The above-described configuration can adjust both the thermal conductivity and permittivity of the electric insulating member. Thus, the thermal conductivity and the capacitance can be optimized in accordance with the specifications of the electric insulating member.

The high thermal conductive material may be aluminum nitride, and the high permittivity material may be barium titanate.

Barium titanate has an extremely-high relative permittivity, and aluminum nitride has an extremely-high thermal conductivity. Thus, both the thermal conductivity and permittivity of the electric insulating member can be easily adjusted and enhanced.

The electric insulating member may have a first portion made of a high thermal conductive material having a higher thermal conductivity than that of aluminum oxide, and a second portion made of a high permittivity material having a higher relative permittivity than that of aluminum oxide.

With this configuration, the electric insulating member can be formed without degradation of the properties of both the high thermal conductive material and the high permittivity material. Thus, both high thermal conductivity and capacitance of the electric insulating member can be obtained.

Particularly, this configuration is advantageous in manufacturing when applied to the above-described another form of the storage structure because the electric insulating member can be manufactured by a combination of existing methods even if different materials are used.

The high thermal conductive material may be aluminum nitride, and the high permittivity material may be barium titanate.

With this configuration, both the thermal conductivity and capacitance of the electric insulating member can be obtained at a high level.

The above-described switching module is preferably applicable to an inverter for being interposed between a battery and a motor to drive the motor with power supplied from the battery.

That is, the inverter may include the above-described switching module, and a DC link interposed between the battery and each of the positive-side main line and the negative-side main line. The DC link may have a positive-side junction line interposed between the positive-side main line and the positive electrode of the battery, a negative-side junction line interposed between the negative-side main line and the negative electrode of the battery, and a smoothing capacitor bridging between the positive-side junction line and the negative-side junction line. the storage structure also functioning as a smoothing capacitor in addition to the smoothing capacitor.

With this configuration, the large and expensive smoothing capacitor can be miniaturized, and therefore, the inverter can be inexpensive.

The inverter may include the above-described switching module, and a DC link interposed between the battery and each of the positive-side main line and the negative-side main line. The DC link may have a positive-side junction line interposed between the positive-side main line and the positive electrode of the battery, and a negative-side junction line interposed between the negative-side main line and the negative electrode side of the battery. the DC link including no smoothing capacitor, the storage structure functioning as a smoothing capacitor in replacement of the smoothing capacitor.

With this configuration, the smoothing capacitor can be omitted, and therefore, the inverter can be much less expensive.

Advantages of the Invention

The application of the technique disclosed herein to the switching module makes it possible that the smoothing capacitor can be miniaturized or be omitted even though the function that the smoothing capacitor provides is maintained and thus the inverter cost can be reduced. Further, the common mode noise can also be suppressed, thereby facilitating speeding-up of the switching control.

BRIEF DESCRIPTION OF DRAWINGS

FIG. 12 is a view for describing another configuration of the first modified substrate.

DESCRIPTION OF EMBODIMENTS

Figure 1:
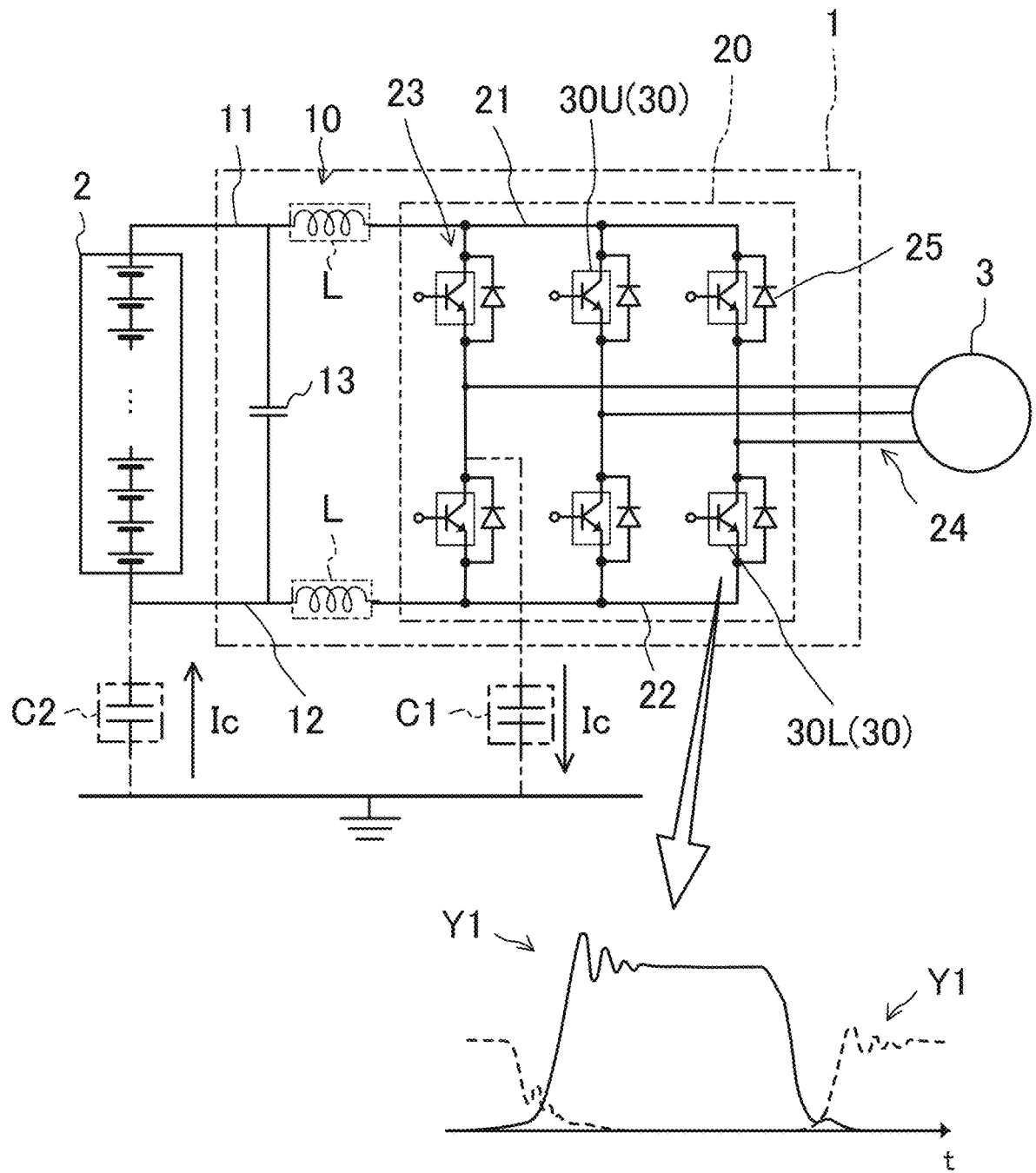
FIG. 1 is a circuit diagram for describing an inverter (unimproved inverter) and a switching module (unimproved module) before application of the technique disclosed herein.

Hereinafter, embodiments of the technique disclosed herein will be described. It should be noted that the following description is merely illustrative in nature.
<Unimproved Inverter, Unimproved Module>
For the sake of easy understanding of the technique disclosed herein, an inverter (unimproved inverter 1) and a switching module (unimproved module 20) before application of the technique disclosed herein will be described as a comparative example.
<Circuit Structures of Unimproved Inverter 1 and Unimproved Module 20>
FIG. 1 illustrates an example of the in-vehicle unimproved inverter 1 equipped with the unimproved module 20. The unimproved inverter 1 is for being mounted on a hybrid vehicle or an electric vehicle. The unimproved inverter 1 is interposed between a high-voltage battery 2 as a power source for the unimproved inverter 1 and a motor 3 that rotates wheels.

A circuit of the unimproved module 20 includes a positive-side main line 21, a negative-side main line 22, three half-bridge circuits 23, and three output lines 24. The positive-side main line 21 is an electric line connected to the positive electrode of the battery 2. The negative-side main line 22 is an electric line connected to the negative electrode of the battery 2.

The half-bridge circuits 23 are provided in parallel between the positive-side main line 21 and the negative-side main line 22. Each half-bridge circuit 23 has two switching elements 30 (an upper arm switching element 30U and a lower arm switching element 30L). Here, the switching elements 30 are IGBTs.

The upper arm switching element 30U and the lower arm switching element 30L are connected in series in this order from the positive-side main line 21 side. Each switching element 30 is connected in anti-parallel with a free wheel diode 25. These half-bridge circuits 23 form an inverter circuit.

Each output line 24 is connected to a portion between the upper arm switching element 30U and the lower arm switching element 30L in a corresponding one of the half-bridge circuits 23. These output lines 24 are connected to the motor 3.

The unimproved inverter 1 includes a control circuit (not shown) that performs switching control. The control circuit is connected to each switching element 30. The control circuit turns on or off each switching element 30 at a predetermined drive frequency (e.g., 10 kHz) by the switching control. Accordingly, the control circuit converts DC power supplied from the battery 2 into three-phase AC power of U, V, and W phases, and supplies the AC power to the motor 3 via each output line 24.

The unimproved module 20 is connected to the battery 2 via a DC link 10. The DC link 10 is a circuit interposed between the battery 2 and each of the positive-side main line 21 and the negative-side main line 22.

The DC link 10 includes a positive-side junction line 11 interposed between the positive-side main line 21 and the positive electrode of the battery 2, a negative-side junction line 12 interposed between the negative-side main line 22 and the negative electrode of the battery 2, and a smoothing capacitor 13 bridging between the positive-side junction line 11 and the negative-side junction line 12.

Figure 2:
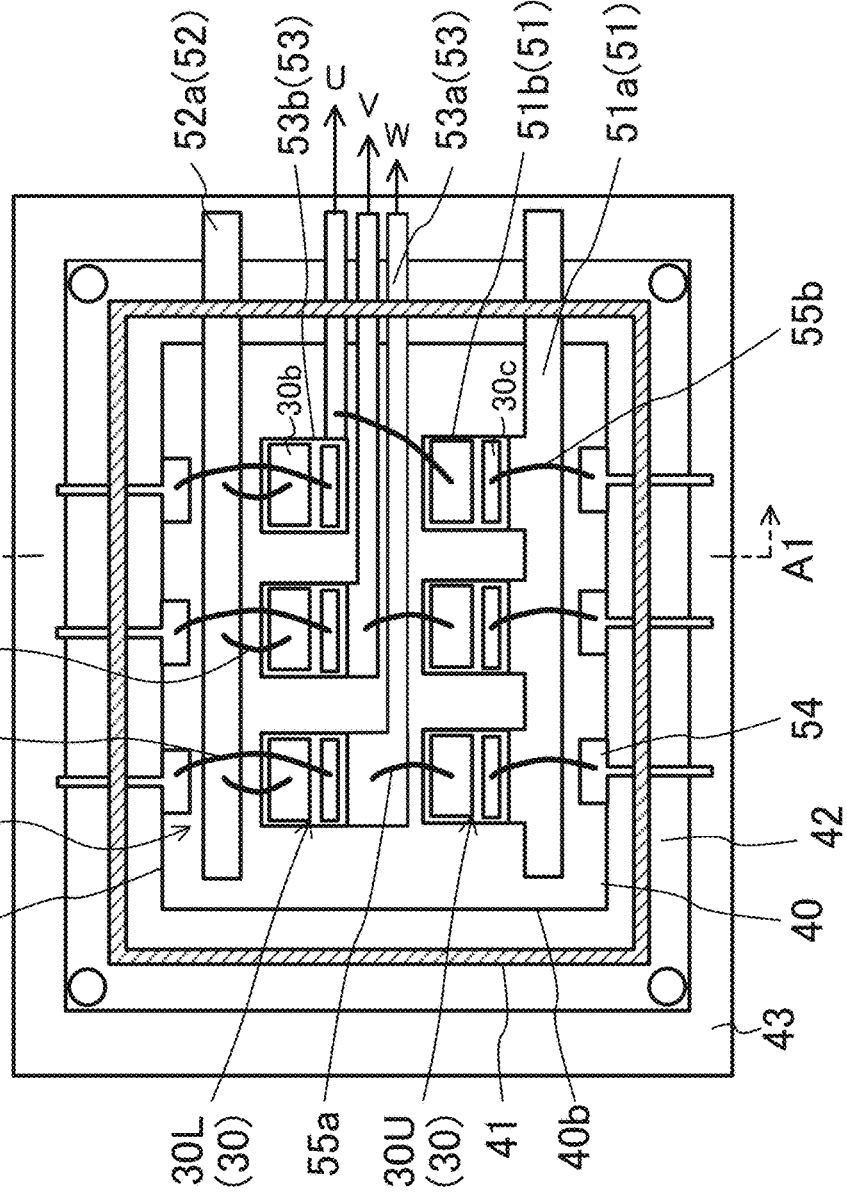
FIG. 2 is a schematic view illustrating the inside of the unimproved module viewed from above.
Figure 3:
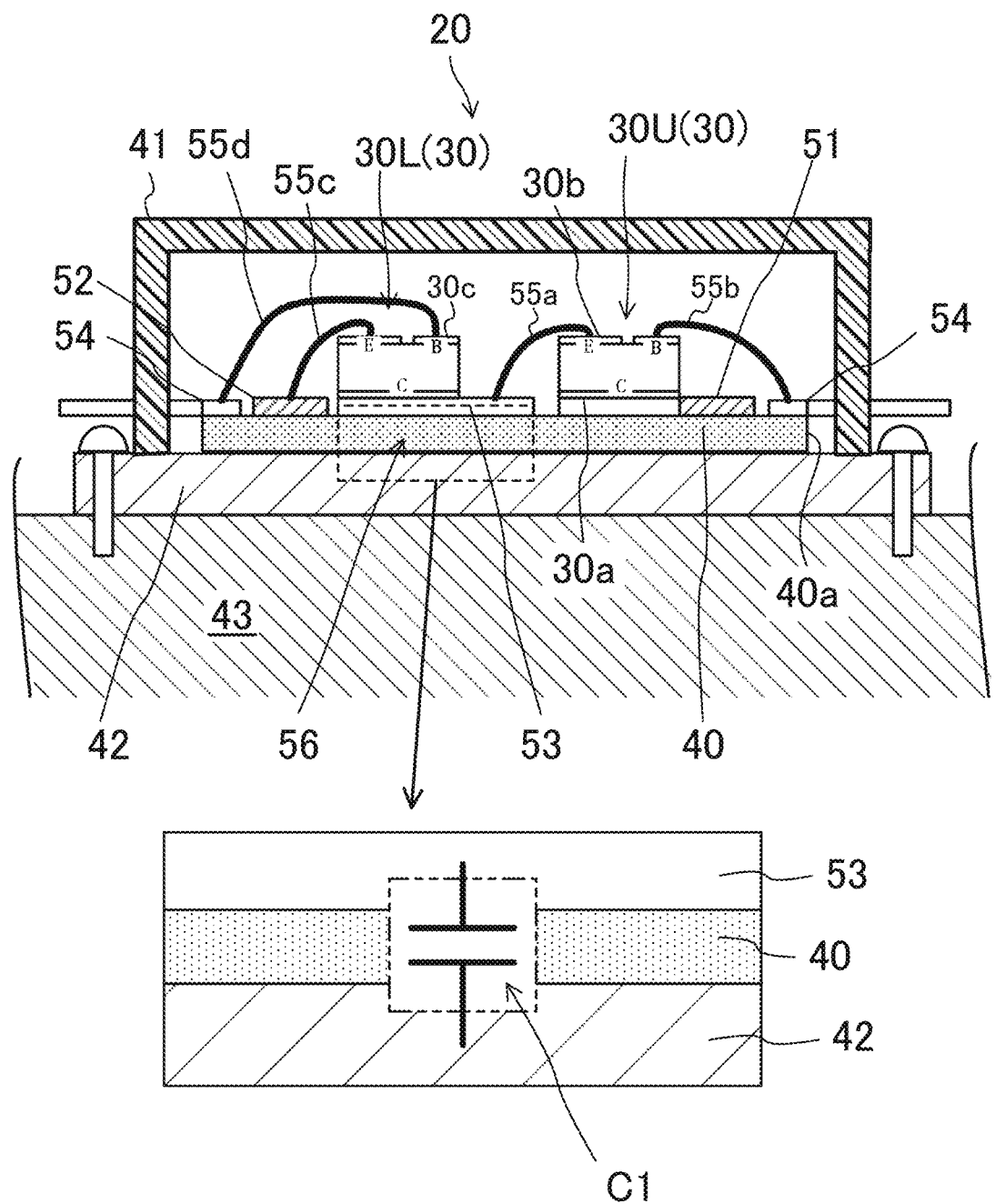
FIG. 3 is a schematic cross-sectional view taken along the arrow A1-A1 of FIG. 2.

The smoothing capacitor 13 is a large film capacitor. That is, a plastic film is used as a dielectric of the smoothing capacitor 13. The plastic film is in the form of lamination, which is formed by winding or layering the plastic film together with metal foil. In this manner, the smoothing capacitor 13 is formed.
(Concreate Structure of Unimproved Module 20)
FIGS. 2 and 3 illustrate a concrete structure of the unimproved module 20. FIG. 2 is a schematic view illustrating the inside of the unimproved module 20 viewed from above. FIG. 3 is a schematic cross-sectional view taken along the arrow A1-A1 of FIG. 2.

The unimproved module 20 includes a substrate 40 (electric insulating member), a case cover 41, and a heat sink 42 (heat radiation member). On the substrate 40, the three half-bridge circuits 23 including the six switching elements 30 (three upper arm switching elements 30U and three lower arm switching elements 30L) are provided.

Here, the switching elements 30 are the IGBTs as described above. A character "C" in the figure indicates a collector electrode 30a (input-side electrode), and a character "E" indicates an emitter electrode 30b (output-side electrode). A character "B" indicates a base electrode 30c (control electrode).

The collector electrode 30a connected to the positive side having a higher voltage generates a greater amount of heat than the emitter electrode 30b connected to the negative side having a lower voltage. The collector electrode 30a is provided over the entirety of the lower surface of the switching element 30.

The emitter electrode 30b and the base electrode 30c are provided on the upper surfaces of the switching elements 30. The emitter electrode 30b is greater in area than the base electrode 30c used for control. Although each switching element 30 is connected in anti-parallel with the free wheel diode 25 (see FIG. 1), illustration thereof is omitted.

The heat sink 42 is a metal member having excellent thermal conductivity and electrical conductivity. The heat sink 42 is formed, for example, in a rectangular plate shape from copper. The heat sink 42 is screwed to an in-vehicle cooler 43. The cooler 43 is preferably of such a water-cooling type that coolant flows inside.

The substrate 40 is formed in a rectangular plate shape from a material having electrical insulation properties, such as aluminum oxide (ceramic material) (that is, the substrate is a so-called alumina substrate). The lower surface of the substrate 40 contacts the upper surface of the heat sink 42. With this configuration, the substrate 40 radiates heat to the cooler 43 via the heat sink 42. The substrate 40 is cooled by the heat sink 42.

The case cover 41 is made of plastic and is formed in the shape of a box opened at bottom. The upper surface of the heat sink 42 is covered with the case cover 41. With this configuration, the periphery of the substrate 40 is covered with the case cover 41, and the substrate 40 is protected by the case cover 41. The inside of the case cover 41 is filled with electric insulating resin.

On the upper surface of the substrate 40, a conductor having a predetermined pattern corresponding to electric wiring is formed. More specifically, copper forming the conductor is joined onto the upper surface of the substrate 40 by a well-known direct bonded copper (DBC) method.

More specifically, as shown in FIG. 2, a positive-side conductor 51 constituting the positive-side main line 21, a negative-side conductor 52 constituting the negative-side main line 22, three output conductors 53 constituting the output lines 24 respectively corresponding to the U, V, and W phases, and six switching conductors 54 constituting switching lines connected to the base electrodes 30*c* of the switching elements 30 are provided in contact with the upper surface of the substrate 40.

Each of the positive-side conductor 51, the negative-side conductor 52, and the output conductors 53 is provided so as to extend in parallel with the long sides (first sides 40*a*) of the substrate 40.

More specifically, the positive-side conductor 51 is provided so as to extend along one first side 40*a*. The negative-side conductor 52 is provided so as to extend along the other first side 40*a*. Each of the output conductors 53 is formed so as to extend between the positive-side conductor 51 and the negative-side conductor 52 along these conductors 51, 52.

The positive-side conductor 51 has a first extending portion 51*a* extending in a band shape along the adjacent first side 40*a* and three first element joint portions 51*b* formed at intervals and projecting from the inner edge of the first extending portion 51*a* toward the center of the substrate 40. The negative-side conductor 52 has a second extending portion 52*a* extending in a band shape along the adjacent first side 40*a*.

Each of the output conductors 53 has a third extending portion 53*a* extending in a band shape along the first side 40*a* and a third element joint portion 53*b* provided at one end of the third extending portion 53*a*. The third element joint portions 53*b* are arranged in parallel with the first side 40*a* at a center portion of the substrate 40, and each third extending portion 53*a* is formed with a length according to arrangement of the third element joint portions 53*b*.

Each of the first extending portion 51*a*, the second extending portion 52*a*, and the third extending portions 53*a* extends outward of the substrate 40 from one of the short sides (second sides 40*b*) of the substrate 40. With this configuration, these end portions on one side protrude from the substrate 40 to form connection terminals.

Three switching conductors 54 on each first side 40*a* are formed at intervals at the edge of the substrate 40.

The lower surface of each upper arm switching element 30U is soldered onto a corresponding one of the first element joint portions 51*b* of the positive-side conductor 51. In this way, the collector electrode 30*a* of each upper arm switching element 30U is connected to the positive-side main line 21.

The emitter electrode 30*b* of each upper arm switching element 30U is connected to the output conductor 53 of the corresponding one of the phases via a first bonding wire 55*a*. In this way, the emitter electrode 30*b* of each upper arm switching element 30U is connected to the output line 24. The base electrode 30*c* of each upper arm switching element 30U is connected to a corresponding one of the switching conductors 54 via a second bonding wire 55*b*.

The lower surface of each lower arm switching element 30L is soldered onto the third element joint portion 53*b* of the output conductor 53 of the corresponding one of the phases. In this way, the collector electrode 30*a* of each lower arm switching element 30L is connected to the output line 24 of the corresponding one of the phases.

The emitter electrode 30*b* of each lower arm switching element 30L is connected to the negative-side conductor 52 via a third bonding wire 55*c*. In this way, the collector electrode 30*a* of each lower arm switching element 30L is connected to the negative-side main line 22.

The base electrode 30*c* of each lower arm switching element 30L is connected to a corresponding one of the switching conductors 54 via a fourth bonding wire 55*d*. Each switching conductor 54 is provided to switch whether to flow current in a current path between the collector electrode 30*a* and the emitter electrode 30*b*.

As described above, a group of the first element joint portions 51*b* and the third element joint portions 53*b* is arranged at the center portion of the substrate 40. Accordingly, the upper arm switching elements 30U and the lower arm switching elements 30L are concentratedly arranged in a center portion on the upper surface of the substrate 40.

(Problems in Unimproved Inverter)

The unimproved inverter 1 has various problems such as common mode noise.

The output conductor 53 of each phase (particularly, a portion of the output conductor 53 in which the collector electrode 30*a* of the lower arm switching element 30L is present, and a midpoint portion 56) faces the heat sink 42 via the substrate 40. The heat sink 42 is grounded by being attached to the in-vehicle cooler 43. Accordingly, as shown in FIG. 3 in close-up, a predetermined stray capacitance is formed at the midpoint portion 56 (for the sake of convenience, the stray capacitance is expressed as a first virtual capacitor C1).

The in-vehicle battery 2 is supported in a floating state. Thus, a certain stray capacitance (second virtual capacitor C2) exists between the battery 2 and the ground, as illustrated in FIG. 1.

When the unimproved inverter 1 operates, each switching element 30 is turned on or off at the predetermined drive frequency by the switching control. Accordingly, a rectangular-waved high voltage including a harmonic component is applied to the midpoint portion 56, and therefore, voltage intermittently changes in the output conductor 53.

Accordingly, common mode current flows via a current path passing through the first virtual capacitor C1 and the second virtual capacitor C2, as indicated by an arrow Ic in FIG. 1. As a result, the common mode noise occurs.

The rated voltage of the battery 2 is, for example, a high voltage of 40 V or more or 300 V or more. Thus, a voltage change at the midpoint portion 56 is great, and consequently, the common mode current and the common mode noise are also great.

Great current periodically flows in the DC link 10 by the switching control. That is, such high-frequency great current generates normal mode current. As a result, normal mode noise occurs.

The smoothing capacitor 13 suppresses such normal mode current. That is, great current (ripple current) flows in the smoothing capacitor 13 by the switching control. In this manner, a high-frequency impedance between positive and negative supply powers from the battery 2 can be reduced.

Thus, it is inevitable that the smoothing capacitor 13 is increased in size in order to suppress the normal mode current.

The smoothing capacitor 13 generates heat due to a power loss caused by the ripple current and internal resistance. However, it is difficult for the smoothing capacitor 13, which is the large film capacitor, to radiate heat.

For these reasons, heat generation needs to be suppressed by reduction in the internal resistance in order to suppress an increase in the temperature of the smoothing capacitor 13 for the sake of ensuring reliability. Thus, the capacitance of the smoothing capacitor 13 needs to be an excessive value more than necessary. For example, a capacitance of about 500 μF is required. For this reason, the smoothing capacitor 13 is expensive, and is a great cause for an inverter cost increase.

Generally, the positive-side junction line 11 and the negative-side junction line 12 are bus bars (rod- or plate-shaped metal conductor for great current). Thus, parasitic inductances (indicated by virtual inductors L in FIG. 1) in these bus bars are great. There is a junction capacitance in each switching element 30.

When the switching control is performed, resonance occurs among these inductors L and these junction capacitances. Accordingly, small vibration (ringing) occurs in the waveforms of the operating current and voltage of each switching element 30, as indicated by the arrow Y1 in FIG. 1.

As the switching control is speeded up, more specifically as the time of transition in switching is shortened, the amplitude of the ringing increases. The ringing includes a high frequency component. Thus, the ringing is a cause for the normal mode noise and the common mode noise.

Further, the ringing causes surge voltage with great overshoot to the positive or negative side of the battery 2. When such surge voltage exceeds the withstand voltage limit of the switching element 30, the semiconductor of the switching element 30 is damaged.

Thus, for each switching element 30, a withstand voltage property sufficiently higher than the voltage of the battery 2 with a sufficient allowance against such voltage is required. For this reason, it is also inevitable that the switching element 30 is expensive.

<Improved Inverter, Improved Module (First Embodiment)>

Figure 4:
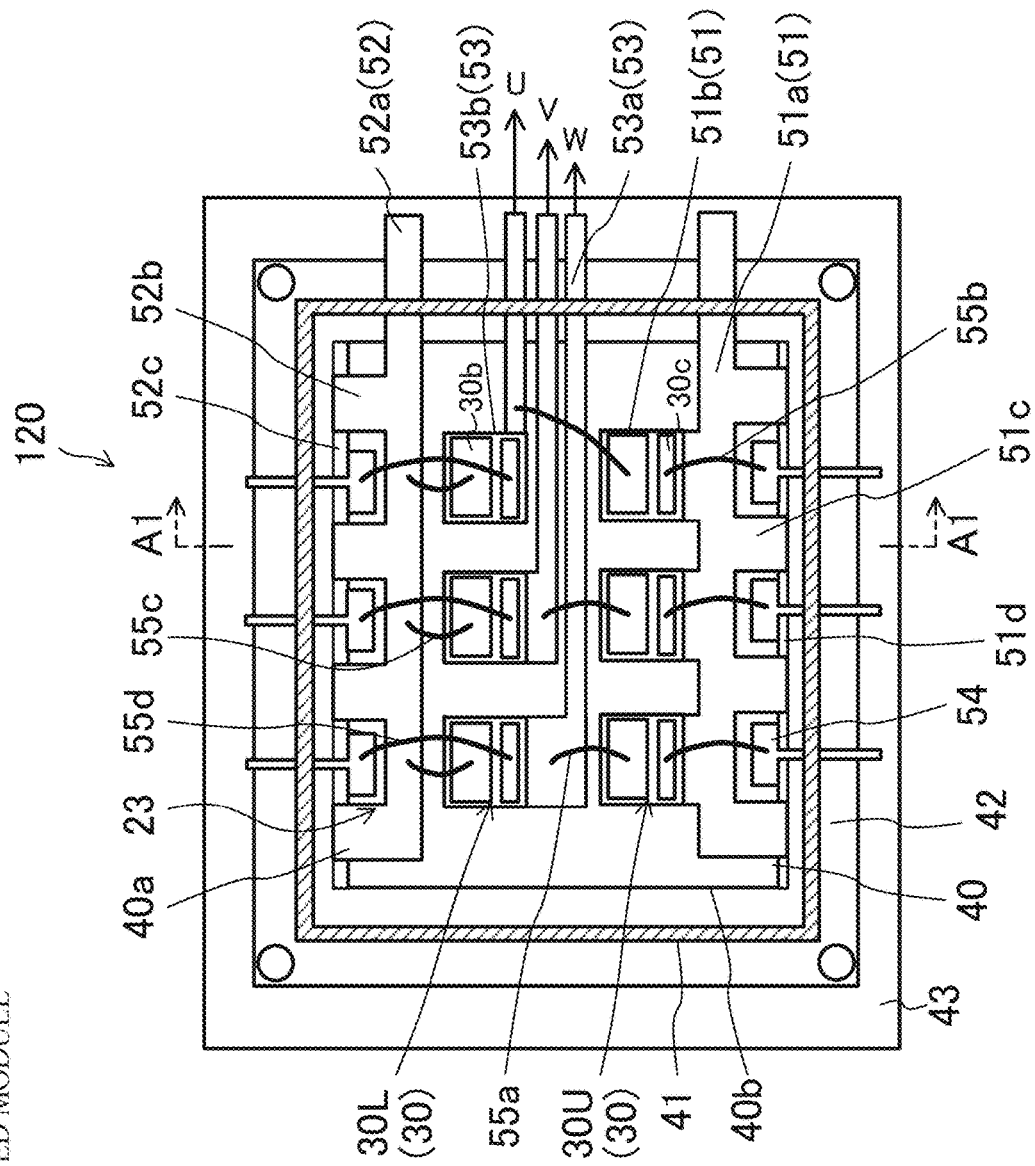
FIG. 4 is a view illustrating a switching module (improved module) to which the technique disclosed herein is applied and corresponding to FIG. 2.
Figure 5:
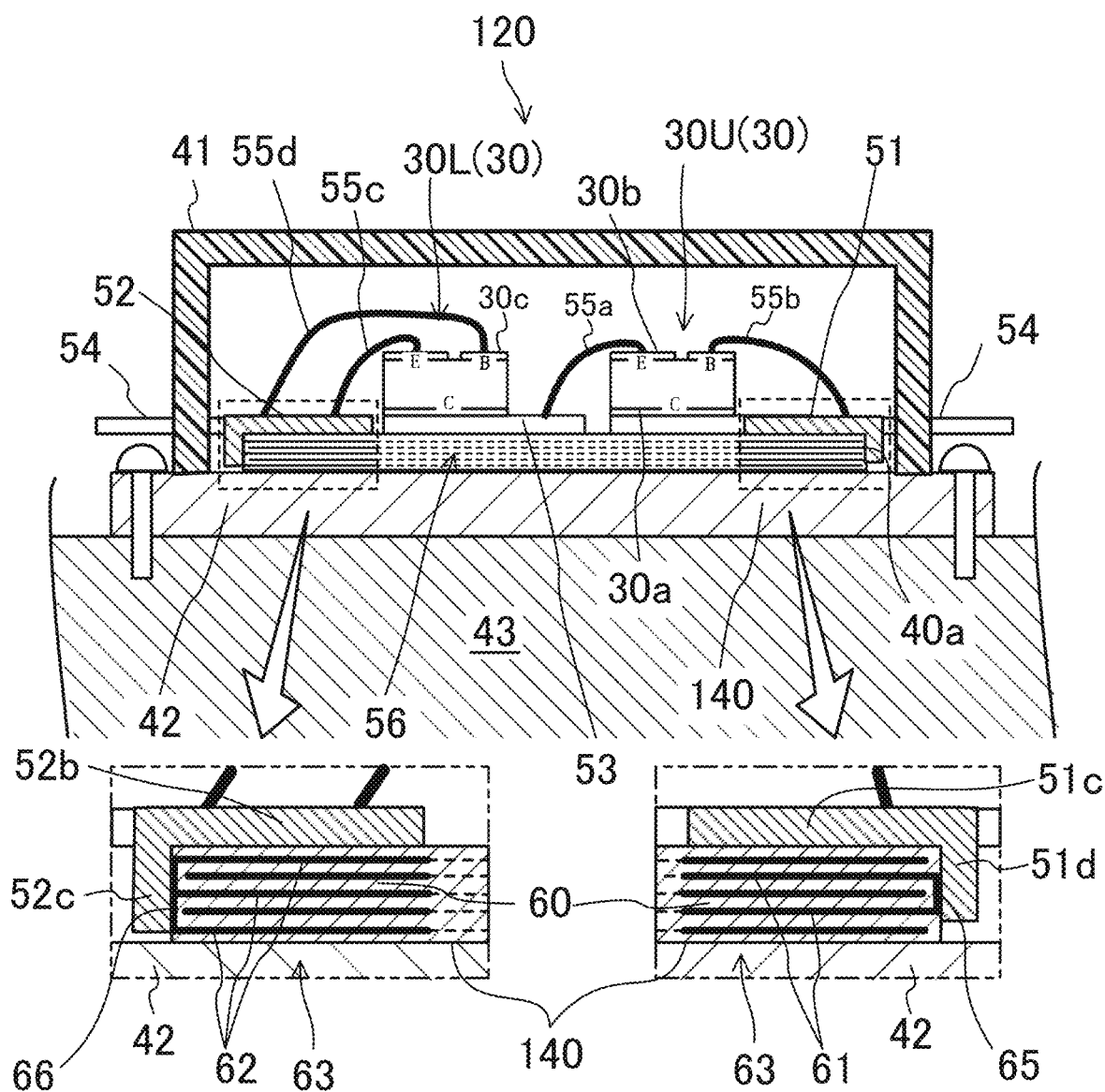
FIG. 5 is a view illustrating the improved module and corresponding to FIG. 3.

FIGS. 4 and 5 illustrate, as an example, a switching module (improved module 120) to which the technique disclosed herein is applied. FIG. 4 is a view corresponding to FIG. 2. FIG. 5 is a view corresponding to FIG. 3.

A basic structure of the improved module 120 is the same as that of the unimproved module 20. Thus, the like reference numerals are used to represent members having the like configurations, and description thereof will be simplified or omitted.

The improved module 120 is different from the unimproved module 20 particularly in that a storage structure 63 according to the present disclosure is provided in the substrate. Hereinafter, differences, which include the difference in the substrate (improved substrate 140), from the unimproved module 20 will be described in detail.

As illustrated in FIGS. 4 and 5, the positive-side conductor 51 has, in addition to the first extending portion 51a and the first element joint portion 51b, four first outwardly-projecting portions 51c formed at intervals and projecting from the outer edge of the first extending portion 51a toward the adjacent first side 40a and a first side end portion 51d extending in contact with the end surface of the first side 40a, and bridging the projecting ends of the first outwardly-projecting portions 51c.

The negative-side conductor 52 has, in addition to the second extending portion 52a, four second outwardly-projecting portions 52b formed at intervals and projecting from the outer edge of the second extending portion 52a toward the adjacent first side 40a and a second side end portion 52c extending in contact with the end surface of the first side 40a and bridging the projecting ends of the second outwardly-projecting portions 52b.

(Improved Substrate 140)

The improved substrate 140 includes a plurality of electric insulating layers 60, a plurality of positive-side electric conductive layers 61 connected to the positive-side conductor 51, and a plurality of negative-side electric conductive layers 62 connected to the negative-side conductor 52.

Each positive-side electric conductive layer 61 and each negative-side electric conductive layer 62 face each other via the electric insulating layer 60. With this configuration, the storage structure 63 interposed between the positive-side main line 21 and the negative-side main line 22 and capable of storing electric charges is provided inside the improved substrate 140.

Figure 6:
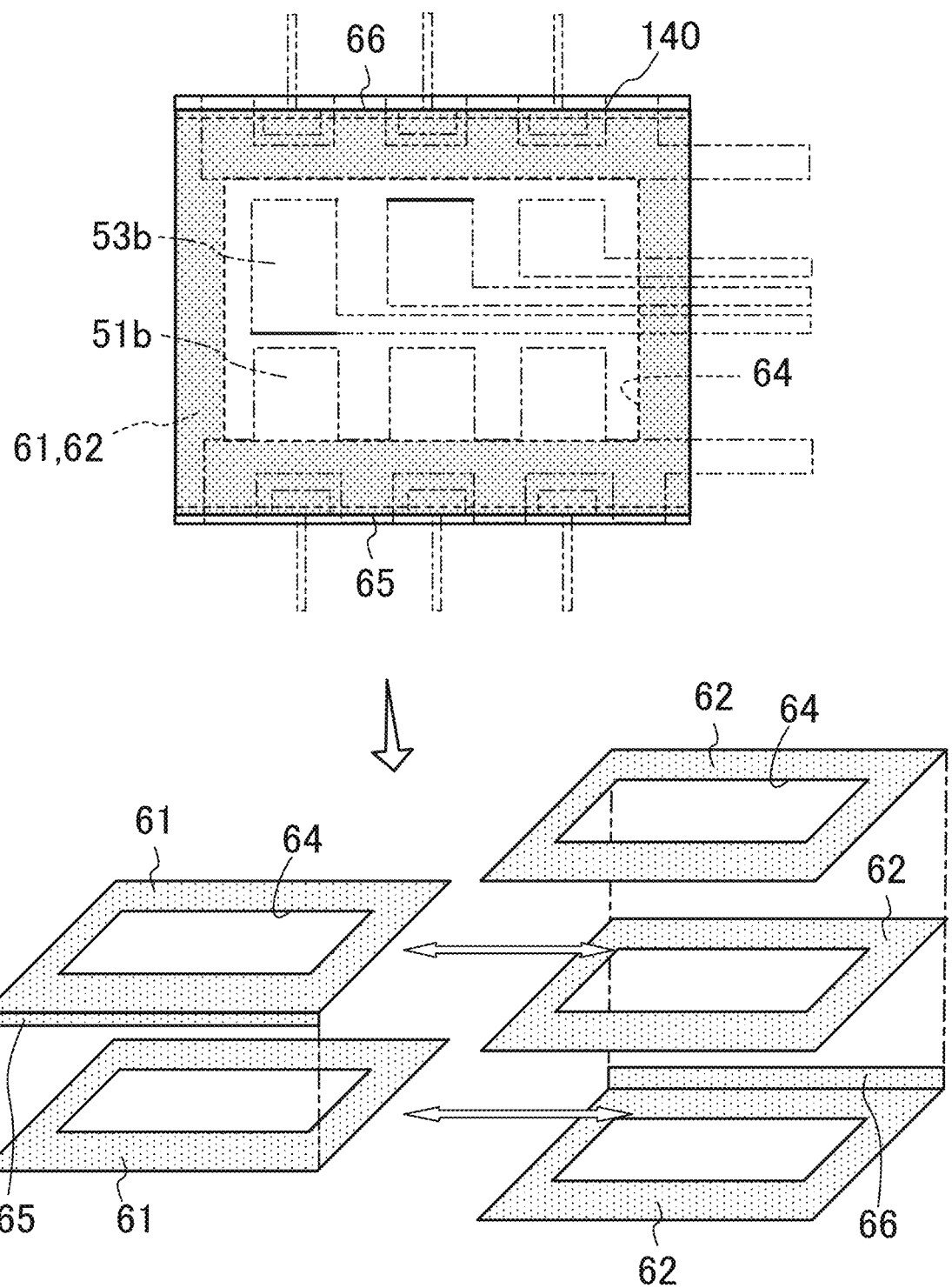
FIG. 6 is a view for describing the configuration of an improved substrate.

More specifically, each of the positive-side electric conductive layers 61 and the negative-side electric conductive layers 62 is formed in a rectangular thin film shape having the substantially same size as that of the improved substrate 140, as illustrated in FIG. 6. Each of the positive-side electric conductive layers 61 and the negative-side electric conductive layers 62 has a rectangular opening 64 in a center portion thereof. The opening 64 is formed such that the group of the first element joint portions 51b and the third element joint portions 53b is accommodated inside the opening 64.

The improved substrate 140 in this case includes two positive-side electric conductive layers 61 and three negative-side electric conductive layers 62. The positive-side electric conductive layers 61 and the negative-side electric conductive layers 62 are alternately formed in parallel with the upper and lower surfaces of the improved substrate 140.

More specifically, the improved substrate 140 is configured such that the electric insulating layer 60, the negative-side electric conductive layer 62, the electric insulating layer 60, the positive-side electric conductive layer 61, the electric insulating layer 60, the negative-side electric conductive layer 62, the electric insulating layer 60, the positive-side electric conductive layer 61, the electric insulating layer 60, the negative-side electric conductive layer 62, and the electric insulating layer 60 are stacked in this order. With this configuration, each positive-side electric conductive layer 61 and each negative-side electric conductive layer 62 face each other in the thickness direction of the improved substrate 140 via the electric insulating layer 60 at an outer edge portion of the improved substrate 140.

As illustrated in FIG. 5 in close-up, each positive-side electric conductive layer 61 is connected to a positive-side conductive end 65 provided at the end surface of one first side 40*a*. Each negative-side electric conductive layer 62 is connected to a negative-side conductive end 66 provided at the end surface of the other first side 40*a*. The positive-side conductive end 65 is soldered to the first side end portions 51*d*. The negative-side conductive end 66 is soldered to the second side end portions 52*c*.

The size of the short side of each of the positive-side electric conductive layers 61 and the negative-side electric conductive layers 62 is slightly smaller than the size of the short side (second side 40*b*) of the improved substrate 140. Thus, the protruding end of each positive-side electric conductive layer 61 is positioned with a margin from the end surface of the other first side 40*a*. The protruding end of each negative-side electric conductive layer 62 is positioned with a margin from the end surface of the one first side 40*a*.

With this configuration, the storage structure 63 interposed between the positive-side main line 21 and the negative-side main line 22 and capable of storing electric charges is provided inside the improved substrate 140. More specifically, a group of positive-side electric conductive layers 61 and a group of negative-side electric conductive layers 62 formed with the electric insulating layers 60 interlayered therebetween form a structure having a certain capacitance and functioning as a smoothing capacitor.

(Details of Improved Substrate 140)

Each switching element 30 generates heat due to the switching control. The improved substrate 140 transfers such heat to the heat sink 42, and the heat sink 42 radiates the heat. Thus, it is preferable that the improved substrate 140 have excellent thermal conductivity. For this reason, it is preferable that the thickness of the improved substrate 140 be thin. For example, the thickness may be preferably 1 mm or less.

On the other hand, it is preferable that the capacitance of the electric insulating layer 60 be high, for the sake of the storage structure 63. For this reason, the material of the improved substrate 140 may be preferably one having a high permittivity.

The improved substrate 140 is made of a ceramic material. Generally, aluminum oxide is used as the ceramic material. The thermal conductivity of aluminum oxide is approximately 23 to 36 W/m·k, and the relative permittivity of aluminum oxide is approximately 9.5 to 9.7.

In the case of the improved substrate 140, it is preferable that both the thermal conductivity and the permittivity thereof be high, as described above. Thus, the improved substrate 140 may be preferably made of such a ceramic material that a material (high permittivity material) having a higher relative permittivity than that of aluminum oxide and a material (high thermal conductive material) having a higher thermal conductivity than that of aluminum oxide are mixed at a predetermined ratio.

Examples of the high permittivity material may include zirconia, titanium oxide, and barium titanate. Examples of the high thermal conductive material may include silicon carbide and aluminum nitride. Particularly, the high permittivity material may be preferably barium titanate having an extremely-high relative permittivity (with a relative permittivity of 1500), and the high thermal conductive material may be preferably aluminum nitride having an extremely-high thermal conductivity (with a thermal conductivity of 90 to 200).

With the configuration in which the high thermal conductive material and the high permittivity material are mixed at the ratio suitable for the improved substrate 140, the improved substrate 140 can be obtained with optimal thermal conductivity and permittivity.

(Manufacturing of Improved Substrate 140)

Figure 7:
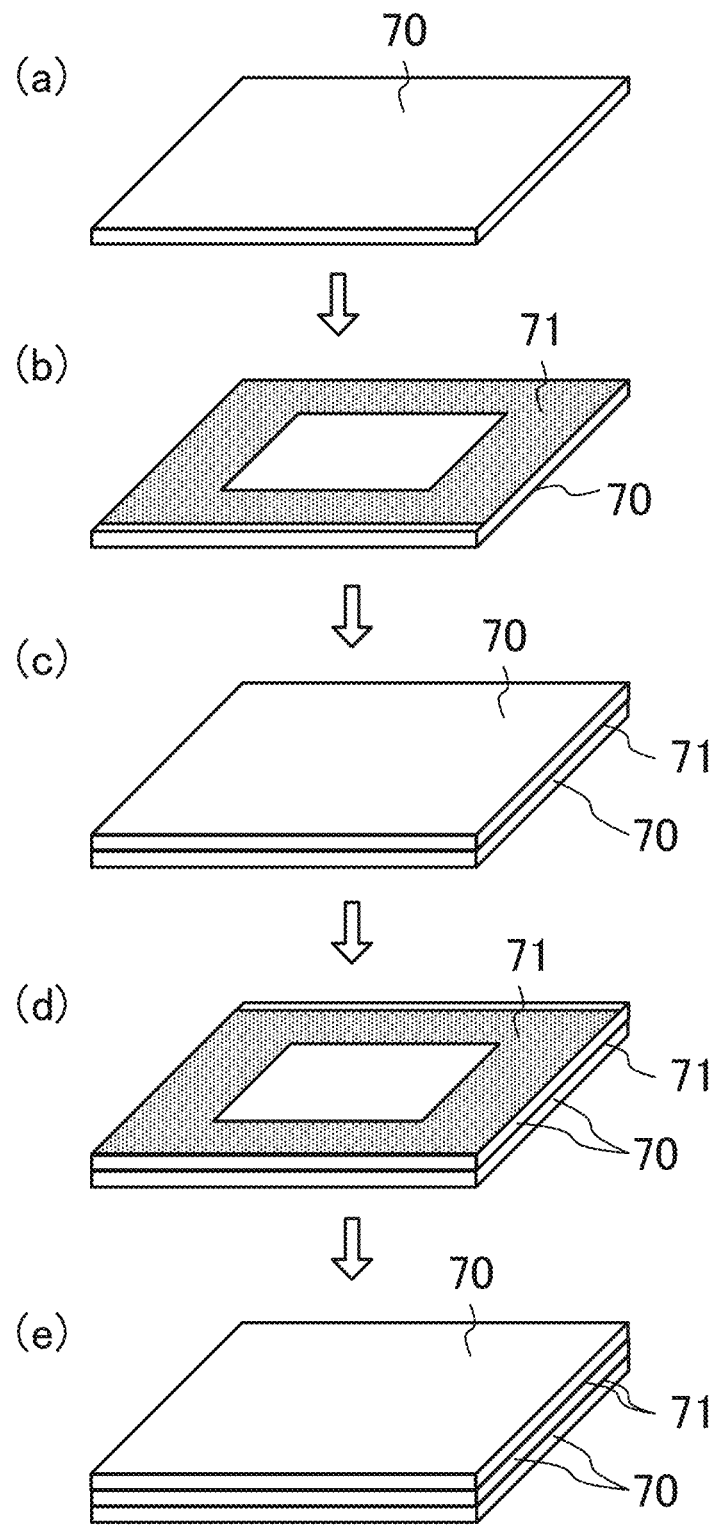
FIG. 7 is a view for describing a method for manufacturing the improved substrate.

Each of the positive-side electric conductive layers 61 and the negative-side electric conductive layers 62 is preferably made of silver paste. With this configuration, the improved substrate 140 can be manufactured by a well-known method for a laminated ceramic capacitor. FIG. 7 illustrates one example of such a method.

As illustrated in (a) of FIG. 7, a thin plate 70 in a paste form is formed from the predetermined ceramic material, which will be the electric insulating layer 60. After that, as illustrated in (b) of FIG. 7, a thin layer 71 made of silver paste, which will be the positive-side electric conductive layer 61, is printed on the thin plate 70. As illustrated in (c) of FIG. 7, a thin plate 70 in a paste form is further formed thereon from the predetermined ceramic material, which will be the electric insulating layer 60.

As illustrated in (d) of FIG. 7, a thin layer 71 made of silver paste, which will be the negative-side electric conductive layer 62, is further printed on the thin plate 70. After that, as illustrated in (e) of FIG. 7, a thin plate 70 in a paste form is further formed on the thin layer 71 using the predetermined ceramic material for the electric insulating layer 60.

A predetermined laminated structure is formed by repetition of the above-described process. Thereafter, the laminated structure is solidified by pressing and sintering, and in this manner, an intermediate of the improved substrate 140 is formed. For example, each end surface of the first sides 40*a* of the formed intermediate of the improved substrate 140 is plated with nickel. After that, each of the positive-side conductive end 65 and the negative-side conductive end 66 is fabricated, and in this manner, the improved substrate 140 is completed.

(Effects of Improved Substrate 140)

The storage structure 63, i.e., the group of the positive-side electric conductive layers 61 and the negative-side electric conductive layers 62 facing each other via the electric insulating layers 60, formed in the improved substrate 140 functions as a virtual capacitor Ci capable of replacing the smoothing capacitor 13 in the circuit of the improved module 120.

Figure 8:
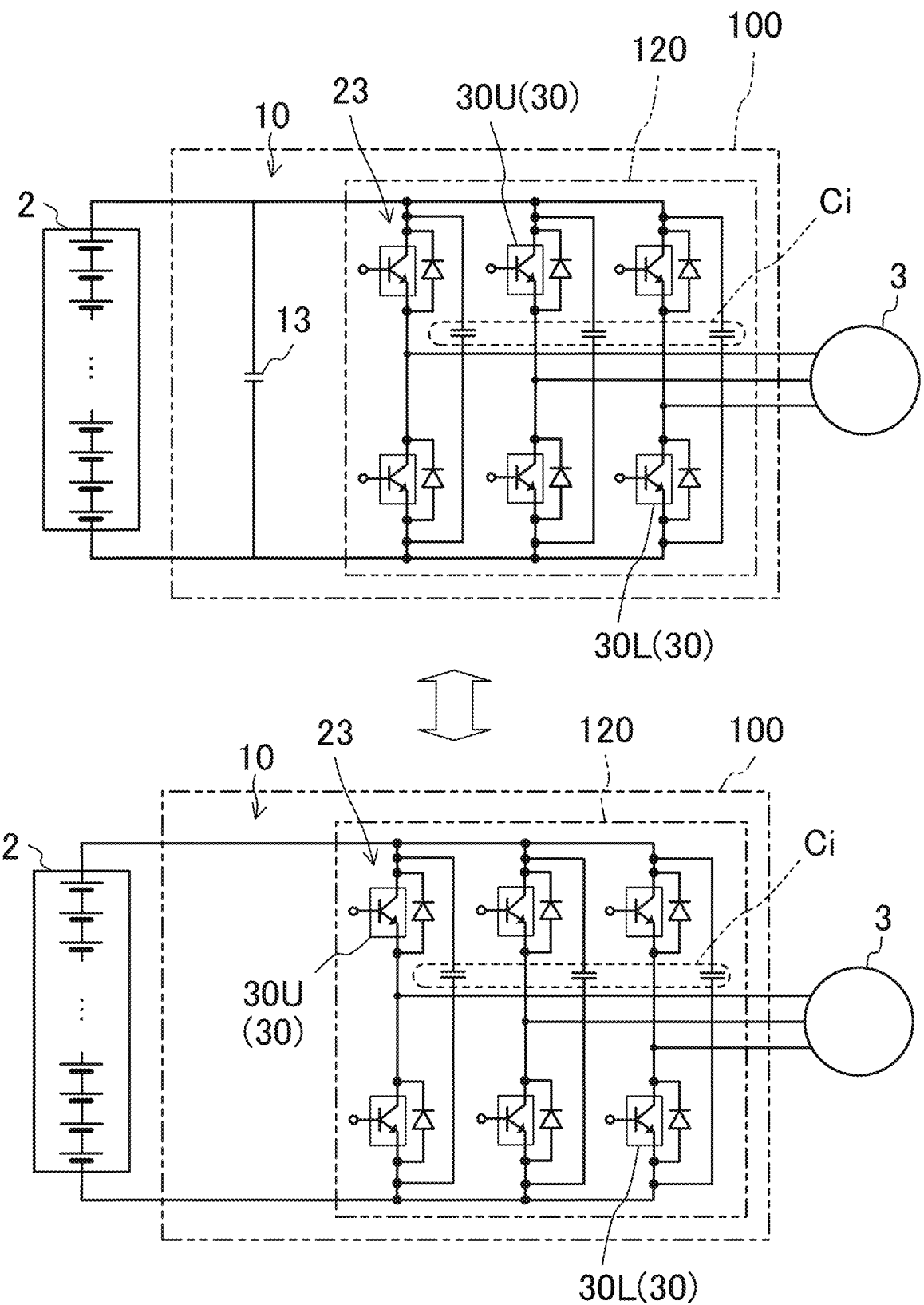
FIG. 8 illustrates circuit diagrams of improved inverters, illustrating examples of a case where a smoothing capacitor is miniaturized and a case where no smoothing capacitor is provided.

FIG. 8 illustrates, as an example, a circuit configuration of an improved inverter 100. In the improved module 120, the virtual capacitor Ci is equivalent to a group of element capacitors connected to both positive and negative-side end portions of each half-bridge circuit 23. That is, the virtual capacitor Ci is connected in parallel with the smoothing capacitor 13 in the circuit of the improved inverter 100, and the storage structure 63 of the improved substrate 140 fulfills the same function as that of the smoothing capacitor 13.

Thus, as illustrated in the upper view of FIG. 8, the smoothing capacitor 13 can be miniaturized, and part thereof can be replaced with the storage structure 63. Further, as illustrated in the lower view of FIG. 8, the smoothing capacitor 13 can be omitted if the storage structure 63 fulfills all the functions of the smoothing capacitor 13. As a result, the inverter cost can be reduced.

Unlike the smoothing capacitor 13, heat generated due to the ripple current can be transferred to the heat sink 42 and be radiated from the heat sink 42 in the case of the storage structure 63. Thus, there is no necessity of excessively increasing the capacitance and decreasing an equivalent series resistance (ESR). A capacitance of approximately 500 uF is required for the smoothing capacitor 13 of the unimproved inverter 1, but the capacitance can be approximately 10 μF to 50 μF in the case of the storage structure 63.

In the case of the improved substrate 140, the storage structure 63 is provided at the outer edge portion of the improved substrate 140, and the group of the switching elements 30 and the storage structure 63 do not overlap with each other. Thus, when the switching control is performed, heat from all the storage structure 63 and the switching elements 30 can be efficiently transferred to the heat sink 42 and radiated from the heat sink 42 although the storage structure 63 and the switching elements 30 generate the heat.

In the case of the storage structure 63, an electric connection length between the storage structure 63 and each switching element 30 is extremely shorter than that between the smoothing capacitor 13 and each switching element 30. Thus, a parasitic inductance due to wiring at such a portion is also extremely low. As a result, almost no ringing and surge voltage as illustrated in FIG. 1 are caused.

That is, in the improved inverter 100 employing the improved module 120, the normal mode noise and the common mode noise can be effectively suppressed. The withstand voltage of each switching element 30 can also be lowered.

<Improved Inverter, Improved Module (Second Embodiment)>

Figure 9:
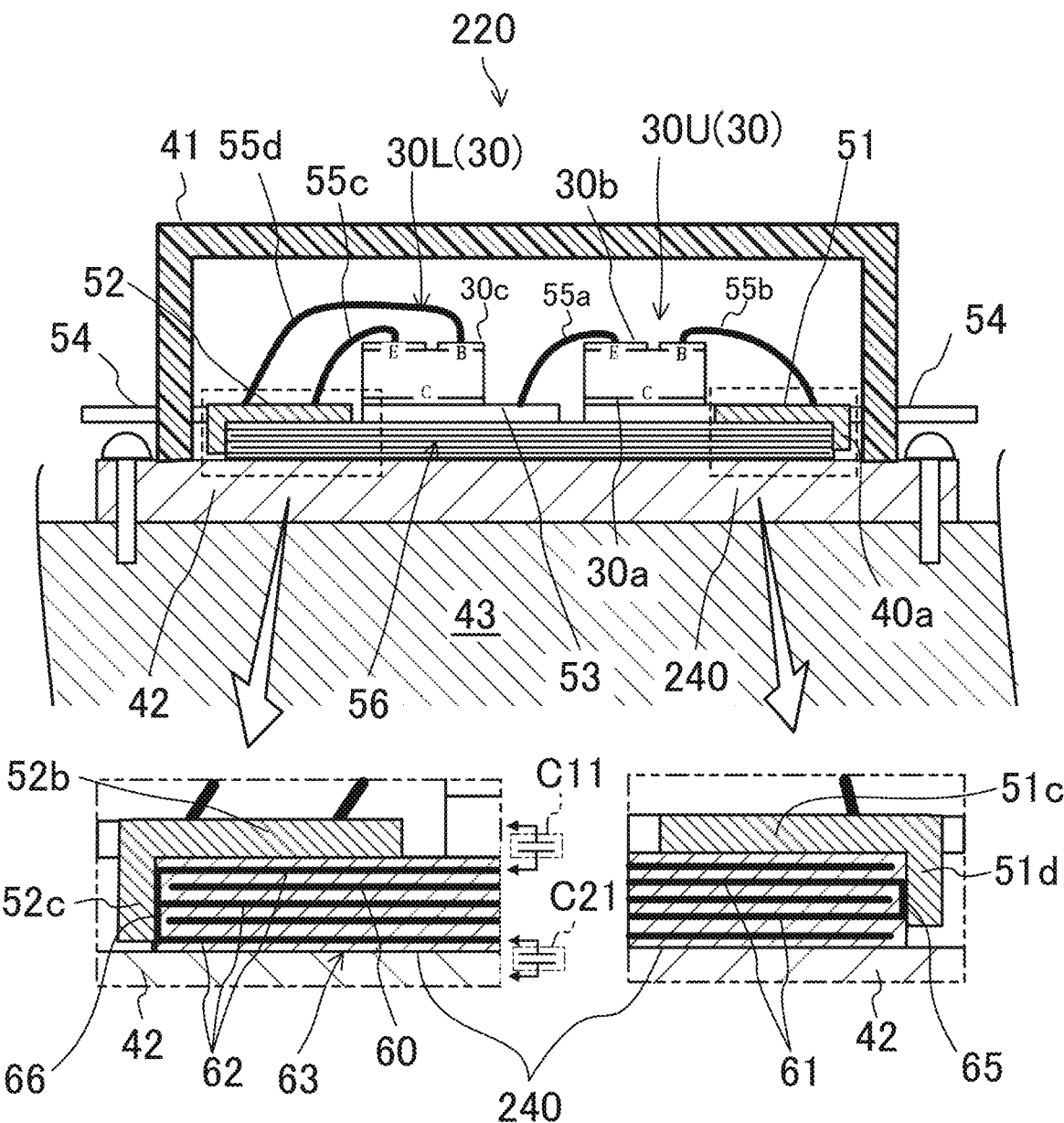
FIG. 9 is a view illustrating a second improved module and corresponding to FIG. 5.

FIG. 9 illustrates, as an example, a second embodiment (second improved module 220) of the switching module to which the technique disclosed herein is applied. FIG. 9 is a view corresponding to FIG. 5.

A basic structure of the second improved module 220 is the same as that of the improved module 120. Thus, the like reference numerals are used to represent members having the like configurations, and description thereof will be simplified or omitted. The second improved module 220 is different from the improved module 120 in that no opening 64 is formed in the center portion of each of the positive-side electric conductive layers 61 and the negative-side electric conductive layers 62.

More specifically, each of the two positive-side electric conductive layers 61 and the three negative-side electric conductive layers 62 in the improved substrate 140 (second improved substrate 240) of the second improved module 220 is formed in a rectangular thin film shape having the substantially same size as that of the improved substrate 140, and is provided over the entire area of the second improved substrate 240.

The positive-side electric conductive layers 61 and the negative-side electric conductive layers 62 are alternately formed in parallel with the upper and lower surfaces of the second improved substrate 240. With this configuration, each positive-side electric conductive layer 61 and each negative-side electric conductive layer 62 face each other in the thickness direction of the second improved substrate 240 via the electric insulating layer 60 over the substantially entirety of the second improved substrate 240.

In the case of the second improved module 220, the storage structure 63 is provided over almost entirety of the second improved substrate 240. Thus, the storage structure 63 is interposed between the heat sink 42 and a large portion of each output conductor 53 including the midpoint portion 56 where the input-side electrode of the lower arm switching element 30L is positioned.

Thus, the flow of common mode current can be prevented, and occurrence of the common mode noise can be prevented. Reasons are detailed as follows.

When the switching control is performed, each switching element 30 is turned on or off at a predetermined timing. Accordingly, the voltage periodically greatly changes at each output conductor 53, particularly at the midpoint portion 56 where the input-side electrode of the lower arm switching element 30L is positioned. Thus, the common mode current flows in the unimproved inverter 1, and the common mode noise occurs therein, as illustrated in FIG. 1.

On the other hand, in the case of the second improved module 220, a first virtual capacitor C11 including the electric insulating layer 60 as a dielectric is provided between the uppermost negative-side electric conductive layer 62 in the second improved substrate 240 and each output conductor 53, as illustrated in FIG. 9 in close-up. Moreover, a second virtual capacitor C21 including the electric insulating layer 60 as a dielectric is also provided between the lowermost negative-side electric conductive layer 62 in the improved substrate 140 and the heat sink 42.

Figure 10:
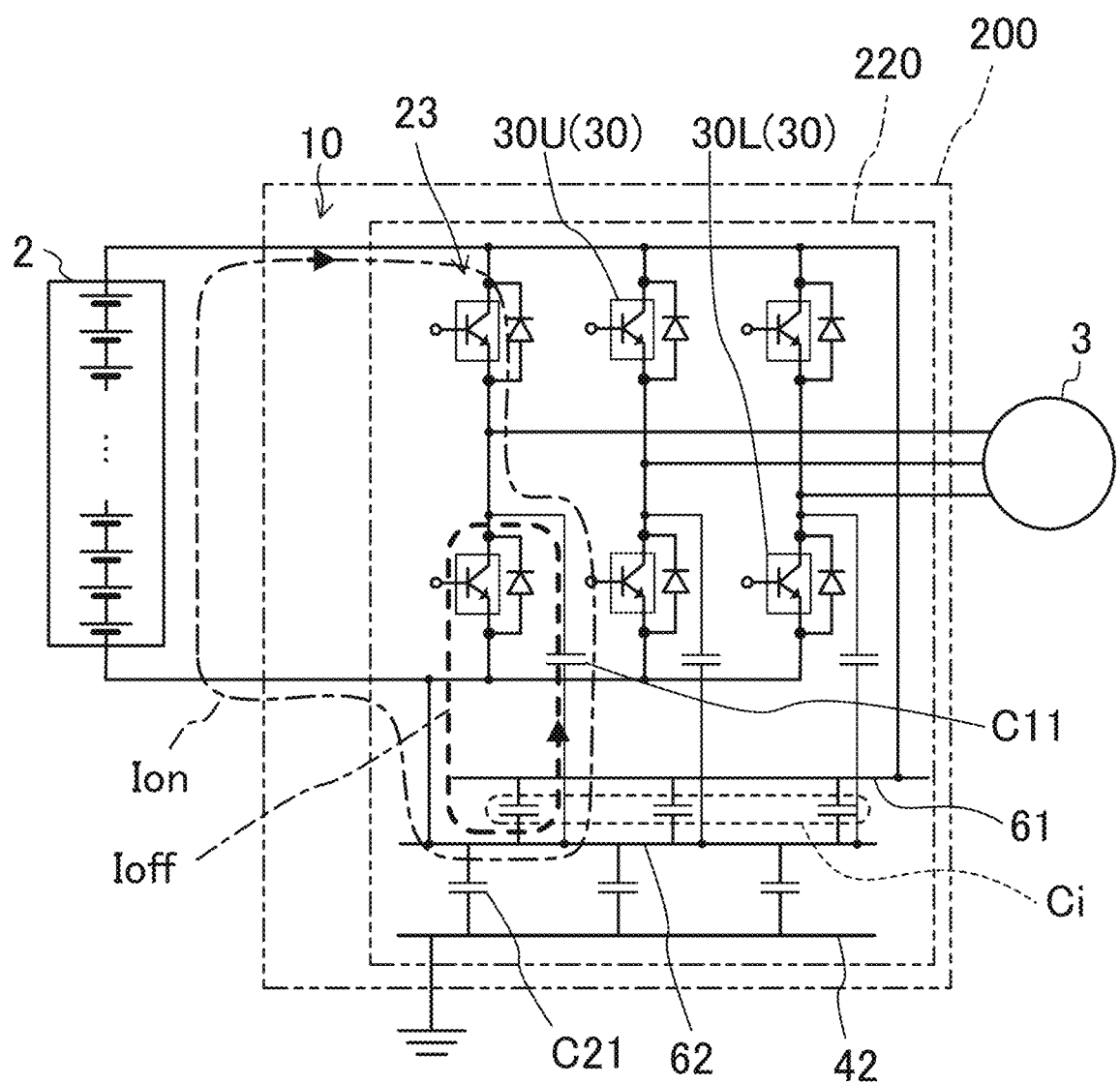
FIG. 10 is a circuit diagram of the second improved inverter.

FIG. 10 illustrates, as an example, a circuit diagram of an inverter (second improved inverter 200) to which the second improved module 220 is applied. Here, one of the half-bridge circuits 23 will be described as an example, but the other half-bridge circuits 23 operate in the same manner, except that the phases thereof are shifted from those of the one described below.

When the lower arm switching element 30L is OFF, the upper arm switching element 30U is ON. Accordingly, current flows as indicated by Ion, and the first virtual capacitor C11 is supplied and charged with the voltage of the battery 2. At this time, the uppermost negative-side electric conductive layer 62 forming the first virtual capacitor C11 is electrically connected to the negative electrode side of the battery 2. Thus, the uppermost negative-side electric conductive layer 62 is at the same potential as that at the negative electrode of the battery 2.

When the lower arm switching element 30L is ON, the upper arm switching element 30U is OFF. Accordingly, current flows as indicated by Ioff, and the charge accumulated in the first virtual capacitor C11 is discharged through a current path passing through the uppermost negative-side electric conductive layer 62. Thus, the uppermost negative-side electric conductive layer 62 is also at the same potential as that at the negative electrode of the battery 2.

The uppermost negative-side electric conductive layer 62 is held at the potential at the negative electrode of the battery 2 regardless of whether the switching element is turned on or off. That is, the potential of the uppermost negative-side electric conductive layer 62 does not change even when the switching control is performed. There is no potential difference between the lowermost negative-side electric conductive layer 62 and the heat sink 42.

That is, since the midpoint portion 56 where a voltage change is great faces the negative-side electric conductive layer 62, whose potential does not change, via the electric insulating layer 60, no charge is accumulated in the second virtual capacitor C21 even when the switching control is performed.

On this point, the potential may only be required to be kept constant, and therefore, the midpoint portion 56 does not necessarily face the negative-side electric conductive layer 62, but may face the uppermost positive-side electric conductive layer 61 via the electric insulating layer 60.

No current flows in a current path passing through the first virtual capacitor C11 and the second virtual capacitor C21. A common mode current value is zero. Thus, according to the second improved inverter 200, almost entire common mode noise can be eliminated.

<Modifications of Improved Substrate>

Next, modifications (modified substrates) of the improved substrate will be described as examples. The modified substrate may be applied to the above-described improved inverter 100 and improved module 120 or the above-described second improved inverter 200 and second improved module 220.

(First Modified Substrate)

Figure 11:
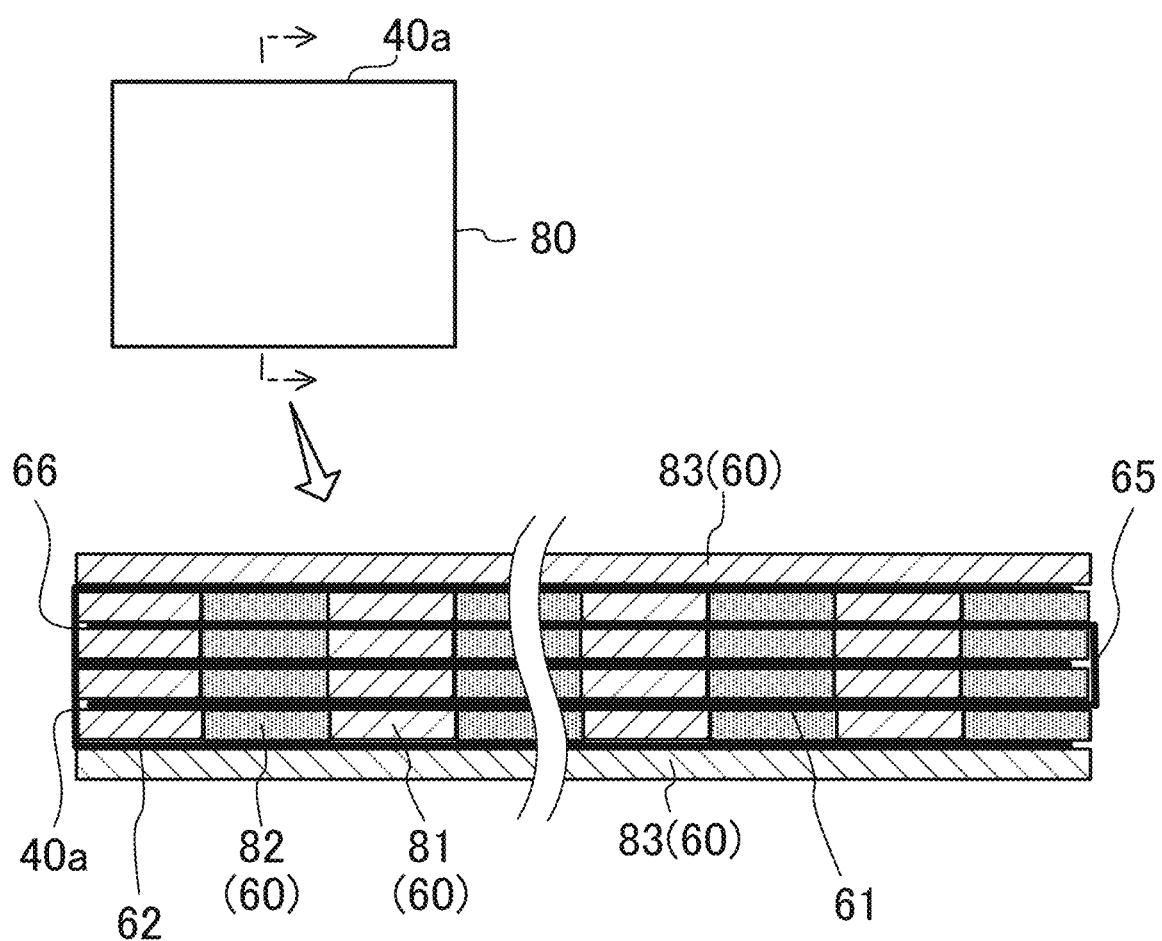
FIG. 11 is a schematic view illustrating a modification (first modified substrate) of the improved substrate.

FIG. 11 illustrates, as an example, a first modified substrate 80. The first modified substrate 80 illustrated therein is modified based on the second improved substrate 240.

The first modified substrate 80 is different from the second improved substrate 240 in the structure of the electric insulating layer 60. The electric insulating layers 60 of the first modified substrate 80 are made of two different materials and are divided into a plurality of portions.

That is, the first modified substrate 80 has portions (first portions 81) made of a high thermal conductive material having a higher thermal conductivity than that of aluminum oxide and portions (second portions 82) made of a high permittivity material having a higher relative permittivity than that of aluminum oxide.

The first portion 81 is made of aluminum nitride, for example. The second portion 82 is made of barium titanate, for example.

The entirely-homogeneous electric insulating layers 60 (covering layers 83) are formed as a pair of outermost layers forming both surfaces (front and back surfaces) of the first modified substrate 80. The covering layer 83 may be made of aluminum oxide, but preferably has excellent thermal conductivity in preference to the permittivity. Thus, in the illustrated example, the same material as that of the first portion 81 is used.

As each electric insulating layer 60 positioned between these covering layers 83, the first portions 81 and the second portions 82 are separately formed in a mixed manner. For example, each of the first portions 81 and the second portions 82 illustrated in FIG. 11 is formed, as illustrated in (a) of FIG. 12, in a linear shape when the first modified substrate 80 is viewed in plane, and these portions 81, 82 are alternately arranged in a stripe pattern.

The first portions 81 and the second portions 82 are not limited to arrangement in the stripe pattern, and arrangement thereof can be selected as necessary according to the specifications of the substrate 40. For example, in a case where the first modified substrate 80 is the above-described improved substrate 140, the second portion 82 having a high permittivity may be arranged at the outer edge portion, where the storage structure 63 is provided, of the improved substrate 140, and the first portion 81 having a high thermal conductivity may be arranged at the center portion, where the group of the switching elements 30 is positioned, of the improved substrate 140, as illustrated in (b) of FIG. 12.

The first portions 81 and the second portions 82 may be arranged in a checkerboard pattern, as illustrated in (c) of FIG. 12. As an alternative, many first portions 81 arranged in a circular pattern may be provided in the second portion 82 when the first modified substrate 80 is viewed in plane, or conversely, many second portions 82 arranged in a circular pattern may be provided in the first portion 81 when the first modified substrate 80 is viewed in plane.

With the configuration in which the electric insulating layers 60 are made of the two materials having different properties as described above, a high thermal conductivity and a great capacitance value of the storage structure 63 can be ensured in the first modified substrate 80.

(Second Modified Substrate)

Figure 13:
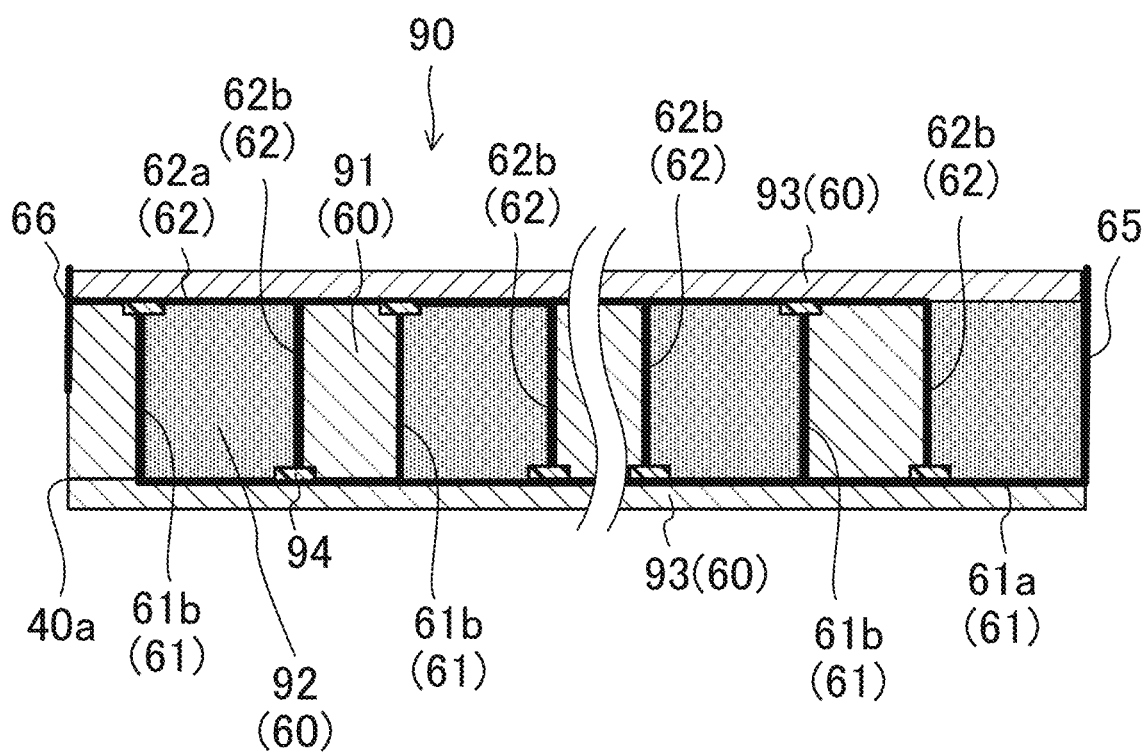
FIG. 13 is a schematic view illustrating a modification (second modified substrate) of the improved substrate.

FIG. 13 illustrates a second modified substrate 90. The second modified substrate 90 is different from the improved substrate 140, the second improved substrate 240, and the first modified substrate 80 in terms of the structures of the positive-side electric conductive layer 61, the negative-side electric conductive layer 62, and the electric insulating layer 60.

As in the first modified substrate 80, the second modified substrate 90 is also configured such that the electric insulating layers 60 are made of two different materials and are divided into a plurality of portions.

That is, the second modified substrate 90 has portions (first portions 91) made of a high thermal conductive material having a higher thermal conductivity than that of aluminum oxide and portions (second portions 92) made of a high permittivity material having a higher relative permittivity than that of aluminum oxide. The first portion 91 is made of aluminum nitride, for example. The second portion 92 is made of barium titanate, for example.

Further, the entirely-homogeneous electric insulating layers 60 (covering layers 93) are provided as a pair of outermost layers forming both surfaces (front and back surfaces) of the second modified substrate 90. The covering layer 93 may be made of aluminum oxide, but may be preferably configured as having excellent thermal conductivity in preference to the permittivity. Thus, in the illustrated example, the same material as that of the first portion 91 is used.

The positive-side electric conductive layer 61 and the negative-side electric conductive layer 62 include a positive-side parallel layer 61a, and a negative-side parallel layer 62a, respectively, and a plurality of positive-side orthogonal layers 61b, and a plurality of negative-side orthogonal layers 62b, respectively. In other words, the positive-side electric conductive layer 61 includes the positive-side parallel layer 61a and the plurality of positive-side orthogonal layers 61b, and the negative-side electric conductive layer 62 includes the negative-side parallel layer 62a and the plurality of negative-side orthogonal layers 62b.

One positive-side parallel layer 61a and one negative-side parallel layer 62a are provided for the second modified substrate 90. In the illustrated example, the positive-side parallel layer 61a extends so as to face the lower surface of the second modified substrate 90 via the outermost electric insulating layer 60 (covering layer 93), and the negative-side parallel layer 62a extends so as to face the upper surface of the second modified substrate 90 via the outermost electric insulating layer 60 (covering layer 93).

The plurality of positive-side orthogonal layers 61b and the plurality of negative-side orthogonal layers 62b are orthogonal to the positive-side parallel layer 61a and the negative-side parallel layer 62a, and are alternately provided so as to extend in parallel with either one of the right and left end surfaces of the second modified substrate 90 (in the illustrated example, the end surface of the first side 40a as the long side).

In other words, the plurality of positive-side orthogonal layers 61b is orthogonal to the positive-side parallel layer 61a and the negative-side parallel layer 62a, and is provided alternately with the negative-side orthogonal layers 62b so as to extend in parallel with the end surface of the first side 40a of the second modified substrate 90. Similarly, the plurality of negative-side orthogonal layers 62b is orthogonal to the positive-side parallel layer 61a and the negative-side parallel layer 62a, and is provided alternately with the positive-side orthogonal layers 61b so as to extend in parallel with the end surface of the first side 40a of the second modified substrate 90.

These positive-side orthogonal layers 61b and negative-side orthogonal layers 62b face each other via the electric insulating layers 60 interlayered therebetween in a direction (side direction) orthogonal to the thickness direction of the second modified substrate 90, thereby forming the storage structure 63.

One end of the positive-side parallel layer 61a extends to the end surface of the right first side 40a, but does not extend to the end surface of the left first side 40a. Similarly, one end of the negative-side parallel layer 62a extends to the end surface of the left first side 40a, but does not extend to the end surface of the right first side 40a. The protruding end of the positive-side orthogonal layer 61b and the negative-side parallel layer 62a are insulated from each other by an insulator 94. The protruding end of the negative-side orthogonal layer 62b and the positive-side parallel layer 61a are also insulated from each other by an insulator 94.

The positive-side conductive end 65 covering the end surface of the right first side 40a is formed on such an end surface. The negative-side conductive end 66 covering the end surface of the left first side 40a is formed on such an end surface. The positive-side conductive end 65 is connected to the positive-side parallel layer 61a, and the negative-side conductive end 66 is connected to the negative-side parallel layer 62a.

The electric insulating layers 60 are provided such that each of the first portions 91 and the second portions 92 is separately formed between the positive-side orthogonal layer 61b and the negative-side orthogonal layer 62b in a mixed manner. More specifically, the positive-side orthogonal layers 61b and the negative-side orthogonal layers 62b are alternately arranged in the side direction, and the first portion 91 or the second portion 92 is formed between the positive-side orthogonal layer 61b and the negative-side orthogonal layer 62b in an alternate manner.

The storage structure 63 formed in the second modified substrate 90, i.e., the group of the positive-side orthogonal layers 61b and the negative-side orthogonal layers 62b facing each other via the electric insulating layers 60, functions as the above-described virtual capacitor Ci. In addition, as in the first modified substrate 80, the electric insulating layers 60 are separately provided as the first portions 91 and the second portions 92, and therefore, both a high thermal conductivity and a high capacitance can be ensured.

In the case of the second modified substrate 90, the storage structure 63 is preferably provided over the entire area of the second modified substrate 90. Moreover, the midpoint portion 56 preferably faces the negative-side parallel layer 62a (may face the positive-side parallel layer 61a) via the electric insulating layer 60.

With this configuration, no charge is accumulated between the midpoint portion 56 and the negative-side parallel layer 62a, and therefore, the common mode noise can be prevented, as described above.

Figure 14:
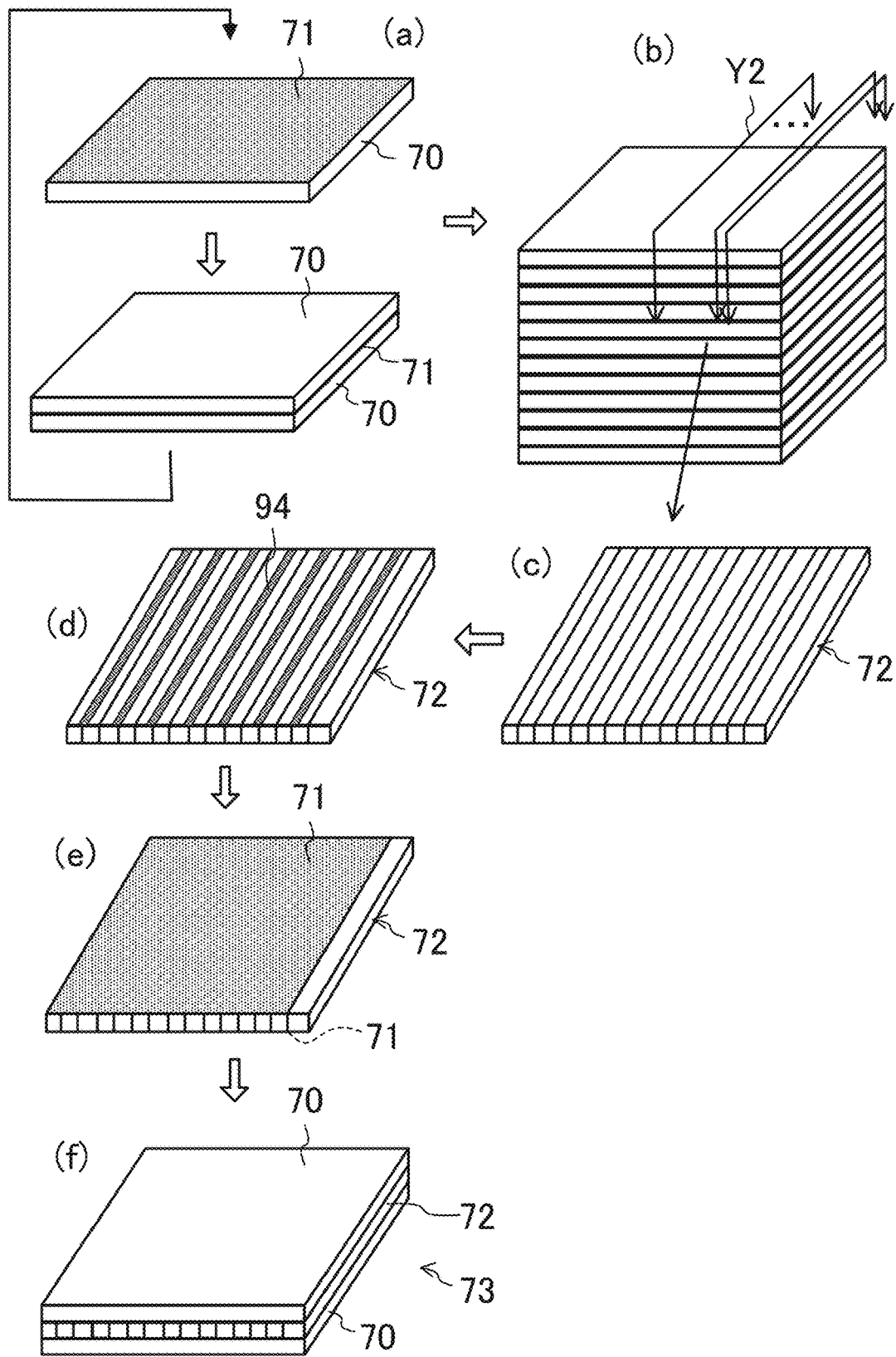
FIG. 14 is a view for describing a method for manufacturing the second modified substrate.

FIG. 14 illustrates, as an example, a method for manufacturing the second modified substrate 90. In the case of the first modified substrate 80, the different materials need to be combined to form the single piece of thin plate 70. However, the second modified substrate 90 can be manufactured by a combination of existing methods. The second modified substrate 90 can be relatively easily mass-produced.

As illustrated in the upper view of (a) of FIG. 14, a thin plate 70 in a paste form is formed from a high thermal conductive material. Silver paste is printed to form a thin layer 71 on the thin plate 70. As illustrated in the lower view of (a) of FIG. 14, a thin plate 70 in a paste form is further formed on the thin layer 71 from a high permittivity material. Silver paste is further printed to form a thin layer 71 on the thin plate 70. This process is repeated a predetermined number of times. Thereafter, the resultant is solidified by pressing and sintering, and in this manner, a mass lamination is formed as illustrated in (b) of FIG. 14.

The mass lamination is sliced into a size corresponding to the thickness of the second modified substrate 90 along a direction orthogonal to a lamination direction, as indicated by the arrow Y2 in (b) of FIG. 14. Then, a first intermediate 72 of the second modified substrate 90 is obtained as illustrated in (c) of FIG. 14.

Next, as illustrated in (d) of FIG. 14, an insulator 94 is printed on both surfaces of the first intermediate 72 to cover the positive-side orthogonal layer 61b exposed on the upper side and cover the negative-side orthogonal layer 62b exposed on the lower side.

Next, as illustrated in (e) of FIG. 14, a thin layer 71 of silver paste is printed on both surfaces of the first intermediate 72 to form the negative-side parallel layer 62a on the upper side and form the positive-side parallel layer 61a on the lower side. Thereafter, as illustrated in (f) of FIG. 14, a thin plate 70 in a paste form is formed on both sides of the first intermediate 72 from a high thermal conductive material. Then, the resultant is solidified by pressing and sintering, and in this manner, a second intermediate 73 is formed.

Thereafter, each end surface of the first sides 40a of the second intermediate 73 is plated with nickel, for example. After that, each of the positive-side conductive end 65 and the negative-side conductive end 66 is fabricated, and in this manner, the second modified substrate 90 is completed.

<Effects of Disclosed Technique, Application, Etc.>

As described above, according to the technique disclosed herein, the large expensive smoothing capacitor 13 essential for the unimproved module 20 can be replaced with the storage structure 63 provided in the substrate 40. In other words, the easily-coolable smoothing capacitor 13 can be formed using existing members. Thus, the smoothing capacitor can be miniaturized or be omitted, which the function that the smoothing capacitor provides is maintained. As a result, the inverter cost can be reduced, and the inverter can be less expensive.

The parasitic inductance of the DC link 10 is eliminated, and the adversely-affecting ringing due to the switching control is reduced. Thus, the normal mode noise can be suppressed. Furthermore, with the configuration in which the midpoint portion 56 where a voltage change in the half-bridge circuit 23 is great and the heat sink 42 are blocked from each other via the conductive layer with the stable potential, the common mode current path can be blocked and, consequently, the common mode noise can be effectively suppressed. Thus, the function of the inverter can be improved.

Furthermore, with the configuration in which the electric insulating layer 60 is configured with the high thermal conductive material and the high permittivity material in combination as above, both high thermal conductivity and capacitance of the substrate 40 can be attained. The function of the inverter can be further improved.

The disclosed technique is not limited to the embodiments and also includes various other configurations. For example, a well-known semiconductor chip such as a MOSFET, a bipolar transistor, an IGBT, or GaN can be applied to the switching element 30.

The number of positive-side electric conductive layers 61 and the number of negative-side electric conductive layers 62 described or illustrated herein are merely examples. The number of formed positive-side orthogonal layers 61b and the number of formed negative-side orthogonal layers 62b described or illustrated herein are one example. The arrangement, shapes, etc. of the layers in the storage structure may be improved in accordance with specifications as required.

The technique disclosed herein is suitably applicable to in-vehicle inverters, but is also applicable to other types of electric equipment.

DESCRIPTION OF REFERENCE CHARACTERS

1 Unimproved Inverter
2 Battery
3 Motor
10 DC Link
11 Positive-Side Junction Line
12 Negative-Side Junction Line
13 Smoothing Capacitor
20 Unimproved Module
21 Positive-Side Main Line
22 Negative-Side Main Line
23 Half-Bridge Circuit
24 Output Line
25 Free Wheel Diode
30 Switching Element
30a Collector Electrode (Input-Side Electrode)
30b Emitter Electrode (Output-Side Electrode)
30c Base Electrode (Control Electrode)
30U Upper Arm Switching Element
30L Lower Arm Switching Element
40 Substrate (Electric Insulating Member)
41 Case Cover
42 Heat Sink (Heat Radiation Member)
43 Cooler
51 Positive-Side Conductor
51a First Extending Portion
51b First Element Joint Portion
51c First Outwardly-Projecting Portion
51d First Side End Portion
52 Negative-Side Conductor
52a Second Extending Portion
52b Second Outwardly-Projecting Portion
52c Second Side End Portion
53 Output Conductor
53a Third Extending Portion
53b Third Element Joint Portion
54 Switching Conductor
56 Midpoint Portion
60 Electric Insulating Layer
61 Positive-Side Electric Conductive Layer
61a Positive-Side Parallel Layer
61b Positive-Side Orthogonal Layer
62 Positive-Side electric conductive layer
62a Negative-Side Parallel Layer
62b Negative-Side Orthogonal Layer
63 Storage Structure
64 Opening
65 Positive-Side Conductive End
66 Positive-Side Conductive End
80 First Modified Substrate
81 First Portion
82 Second Portion
83 Covering Layer
90 Second Modified Substrate
91 First Portion
92 Second Portion
93 Covering Layer
94 Insulator
100 Improved Inverter
120 Improved Module
140 Improved Substrate
200 Second Improved Inverter
220 Second Improved Module
240 Second Improved Substrate

What is claimed is:

1. A switching module, on which switching control is performed, and which includes positive and negative-side main lines each connected respectively to positive and negative electrodes of a battery, a plurality of half-bridge circuits, each of which includes upper and lower arm switching elements connected in series in an order from a positive-side main line side between the positive and negative-side main lines, and a plurality of output lines, each of which is connected between the upper and lower arm switching elements in a corresponding one of the half-bridge circuits, the switching module comprising:

a positive-side conductor in contact with an input-side electrode provided on a lower surface of each upper arm switching element and forming the positive-side main line;

a negative-side conductor connected to an output-side electrode of each lower arm switching element and forming the negative-side main line;

an output conductor in contact with the input-side electrode provided on the lower surface of each lower arm switching element and forming each output line; and an electric insulating member being in contact with, at an upper surface thereof, each of the positive-side conductor, the negative-side conductor, and the output conductor and being in contact with, at a lower surface thereof, a heat radiation member having electrical conductivity, wherein the electric insulating member includes:

a plurality of positive-side electric conductive layers connected to the positive-side conductor; and a plurality of negative-side electric conductive layers connected to the negative-side conductor, wherein each positive-side electric conductive layer faces a corresponding one of the negative-side electric conductive layers via an electric insulating layer such that a storage structure capable of storing charges and interposed between the positive-side main line and the negative-side main line is provided inside the electric insulating member, wherein the positive-side electric conductive layers and the negative-side electric conductive layers include:

positive and negative-side parallel layers extending so as to face the upper and lower surfaces of the electric insulating member via the electric insulating layer; and a plurality of positive-side orthogonal layers and a plurality of negative-side orthogonal layers, which are orthogonal to the positive-side parallel layer and the negative-side parallel layer and are alternately formed so as to extend in parallel with either one of end surfaces of the electric insulating member, and wherein the storage structure is such that the positive-side orthogonal layers and the negative-side orthogonal layers face each other via the electric insulating layer in a side direction orthogonal to a thickness direction of the electric insulating member.

2. The switching module of claim 1, wherein
the storage structure is such that the positive-side electric conductive layers and the negative-side electric conductive layers are alternately formed so as to extend in parallel with the upper and lower surfaces of the electric insulating member, and the each positive-side electric conductive layer faces a corresponding one of the positive side negative-side electric conductive layers via the electric insulating layer in a thickness direction of the electric insulating member.

3. The switching module of claim 2, wherein
the upper arm switching elements and the lower arm switching elements are concentratedly arranged in a center portion on the upper surface of the electric insulating member, and
the storage structure is provided in an outer edge portion of the electric insulating member.

4. The switching module of claim 3, wherein
the electric insulating member is made of such a ceramic material that a high permittivity material having a higher relative permittivity than that of aluminum oxide and a high thermal conductive material having a higher thermal conductivity than that of aluminum oxide are mixed at a predetermined ratio.

5. The switching module of claim 2, wherein
the storage structure is interposed between the heat radiation member and a midpoint portion where at least each lower arm switching element is positioned.

6. The switching module of claim 5, wherein
the storage structure is provided over an entire area of the electric insulating member.

7. The switching module of claim 5, wherein
the electric insulating member is made of such a ceramic material that a high permittivity material having a higher relative permittivity than that of aluminum oxide and a high thermal conductive material having a higher thermal conductivity than that of aluminum oxide are mixed at a predetermined ratio.

8. The switching module of claim 2, wherein
the electric insulating member is made of such a ceramic material that a high permittivity material having a higher relative permittivity than that of aluminum oxide and a high thermal conductive material having a higher thermal conductivity than that of aluminum oxide are mixed at a predetermined ratio.

9. The switching module of claim 1, wherein
the storage structure is interposed between the heat radiation member and a midpoint portion where at least each lower arm switching element is positioned.

10. The switching module of claim 9, wherein
the midpoint portion faces the positive-side parallel layer or the negative-side parallel layer via the electric insulating layer.

11. The switching module of claim 10, wherein
the storage structure is provided over an entire area of the electric insulating member.

12. The switching module of claim 1, wherein
the electric insulating member is made of such a ceramic material that a high permittivity material having a higher relative permittivity than that of aluminum oxide and a high thermal conductive material having a higher thermal conductivity than that of aluminum oxide are mixed at a predetermined ratio.

13. The switching module of claim 12, wherein
the high thermal conductive material is aluminum nitride, and the high permittivity material is barium titanate.

14. The switching module of claim 1, wherein
the electric insulating member has:
a first portion made of a high thermal conductive material having a higher thermal conductivity than that of aluminum oxide, and
a second portion made of a high permittivity material having a higher relative permittivity than that of aluminum oxide.

15. The switching module of claim 14, wherein
the high thermal conductive material is aluminum nitride, and the high permittivity material is barium titanate.

16. An inverter for being interposed between a battery and a motor to drive the motor with power supplied from the battery, comprising:
the switching module of claim 1; and
a DC link interposed between the battery and each of the positive-side main line and the negative-side main line, the DC link including:
a positive-side junction line interposed between the positive-side main line and the positive electrode of the battery; and
a negative-side junction line interposed between the negative-side main line and the negative electrode side of the battery; and
a smoothing capacitor bridging between the positive-side junction line and the negative-side junction line, and
the storage structure also functioning as a smoothing capacitor in addition to the smoothing capacitor.

17. An inverter for being interposed between a battery and a motor to drive the motor with power supplied from the battery, comprising:
the switching module of claim 1; and
a DC link interposed between the battery and each of the positive-side main line and the negative-side main line, the DC link including
a positive-side junction line interposed between the positive-side main line and the positive electrode of the battery, and
a negative-side junction line interposed between the negative-side main line and the negative electrode side of the battery, and
the DC link including no smoothing capacitor, the storage structure functioning as a smoothing capacitor in replacement of smoothing capacitors.

18. A switching module, on which switching control is performed, and which includes positive and negative-side main lines each connected respectively to positive and negative electrodes of a battery, a plurality of half-bridge circuits, each of which includes upper and lower arm switching elements connected in series in an order from a positive-side main line side between the positive and negative-side main lines, and a plurality of output lines, each of which is connected between the upper and lower arm switching elements in a corresponding one of the half-bridge circuits, the switching module comprising:
a positive-side conductor in contact with an input-side electrode provided on a lower surface of each upper arm switching element and forming the positive-side main line;
a negative-side conductor connected to an output-side electrode of each lower arm switching element and forming the negative-side main line;
an output conductor in contact with the input-side electrode provided on the lower surface of each lower arm switching element and forming each output line; and
an electric insulating member being in contact with, at an upper surface thereof, each of the positive-side conductor, the negative-side conductor, and the output conductor and being in contact with, at a lower surface thereof, a heat radiation member having electrical conductivity, wherein the electric insulating member includes:
- a plurality of positive-side electric conductive layers connected to the positive-side conductor; and
- a plurality of negative-side electric conductive layers connected to the negative-side conductor, wherein each positive-side electric conductive layer faces a corresponding one of the negative-side electric conductive layers via an electric insulating layer such that a storage structure capable of storing charges and interposed between the positive-side main line and the negative-side main line is provided inside the electric insulating member, and wherein the electric insulating member is made of such a ceramic material that a high permittivity material having a higher relative permittivity than that of aluminum oxide and a high thermal conductive material having a higher thermal conductivity than that of aluminum oxide are mixed at a predetermined ratio.

19. A switching module, on which switching control is performed, and which includes positive and negative-side main lines each connected respectively to positive and negative electrodes of a battery, a plurality of half-bridge circuits, each of which includes upper and lower arm switching elements connected in series in an order from a positive-side main line side between the positive and negative-side main lines, and a plurality of output lines, each of which is connected between the upper and lower arm switching elements in a corresponding one of the half-bridge circuits, the switching module comprising:

a positive-side conductor in contact with an input-side electrode provided on a lower surface of each upper arm switching element and forming the positive-side main line;

a negative-side conductor connected to an output-side electrode of each lower arm switching element and forming the negative-side main line;

an output conductor in contact with the input-side electrode provided on the lower surface of each lower arm switching element and forming each output line; and an electric insulating member being in contact with, at an upper surface thereof, each of the positive-side conductor, the negative-side conductor, and the output conductor and being in contact with, at a lower surface thereof, a heat radiation member having electrical conductivity, wherein the electric insulating member includes:
- a plurality of positive-side electric conductive layers connected to the positive-side conductor; and
- a plurality of negative-side electric conductive layers connected to the negative-side conductor, wherein each positive-side electric conductive layer faces a corresponding one of the negative-side electric conductive layers via an electric insulating layer such that a storage structure capable of storing charges and interposed between the positive-side main line and the negative-side main line is provided inside the electric insulating member, and wherein the electric insulating member includes:
- a first portion made of a high thermal conductive material having a higher thermal conductivity than that of aluminum oxide, and
- a second portion made of a high permittivity material having a higher relative permittivity than that of aluminum oxide.

* * * * *